(12) United States Patent
Yang et al.

(10) Patent No.: US 9,786,625 B2
(45) Date of Patent: Oct. 10, 2017

(54) SEMICONDUCTOR PACKAGES AND METHODS OF PACKAGING SEMICONDUCTOR DEVICES

(71) Applicant: UTAC Headquarters Pte. Ltd., Singapore (SG)

(72) Inventors: Yongbo Yang, Singapore (SG); Antonio Jr. Bambalan Dimaano, Singapore (SG); Chun Hong Wo, Singapore (SG)

(73) Assignee: UNITED TEST AND ASSEMBLY CENTER LTD., Singapore (SG)

( * ) Notice: Subject to any disclaimer, the term of this patent is extended or adjusted under 35 U.S.C. 154(b) by 0 days.

(21) Appl. No.: 14/803,138

(22) Filed: Jul. 20, 2015

(65) Prior Publication Data

US 2015/0325511 A1 Nov. 12, 2015

Related U.S. Application Data

(62) Division of application No. 13/802,769, filed on Mar. 14, 2013, now Pat. No. 9,087,777.

(51) Int. Cl.
*H01L 23/498* (2006.01)
*H01L 23/00* (2006.01)
(Continued)

(52) U.S. Cl.
CPC ............ *H01L 24/27* (2013.01); *H01L 21/486* (2013.01); *H01L 21/4846* (2013.01);
(Continued)

(58) Field of Classification Search
CPC . H01L 2224/32225; H01L 2224/16225; H01L 2224/73253; H01L 2924/15747; H01L 2924/181; H01L 2924/01028; H01L 2924/18161; H01L 21/4846; H01L 21/486; H01L 21/76885; H01L 21/56; H01L 23/3121; H01L 23/3128; H01L 23/49827; H01L 23/49861; H01L 24/33;
(Continued)

(56) References Cited

U.S. PATENT DOCUMENTS 4,132,747 A * 1/1979 Watanabe ................... C08J 5/24
525/180
4,359,491 A * 11/1982 Lai-Chun .............. B44C 1/1716
156/234
(Continued)

FOREIGN PATENT DOCUMENTS

TW 512467 B 12/2002
WO 2011026261 A1 3/2011

*Primary Examiner* — Sophia Nguyen
(74) *Attorney, Agent, or Firm* — Horizon IP Pte. Ltd.

(57) ABSTRACT

Semiconductor packages and methods for forming a semiconductor package are disclosed. The method includes providing a package substrate having first and second major surfaces. The package substrate includes a base substrate having a mold material and a plurality of interconnect structures including via contacts extending through the first to the second major surface of the package substrate. A die having conductive contacts on its first or second surface is provided. The conductive contacts of the die are electrically coupled to the interconnect structures. A cap is formed over the package substrate to encapsulate the die.

20 Claims, 24 Drawing Sheets

(51) Int. Cl.
  *H01L 21/768* (2006.01)
  *H01L 21/48* (2006.01)
  *H01L 23/31* (2006.01)
(52) U.S. Cl.
  CPC .... *H01L 21/76885* (2013.01); *H01L 23/3121* (2013.01); *H01L 23/49811* (2013.01); *H01L 23/49827* (2013.01); *H01L 23/49838* (2013.01); *H01L 23/49861* (2013.01); *H01L 23/49866* (2013.01); *H01L 24/16* (2013.01); *H01L 24/32* (2013.01); *H01L 24/33* (2013.01); *H01L 23/3128* (2013.01); *H01L 23/49816* (2013.01); *H01L 24/48* (2013.01); *H01L 2224/16225* (2013.01); *H01L 2224/16238* (2013.01); *H01L 2224/2919* (2013.01); *H01L 2224/32225* (2013.01); *H01L 2224/48227* (2013.01); *H01L 2224/73265* (2013.01); *H01L 2224/81191* (2013.01); *H01L 2924/00014* (2013.01); *H01L 2924/01028* (2013.01); *H01L 2924/15311* (2013.01); *H01L 2924/15747* (2013.01); *H01L 2924/181* (2013.01); *H01L 2924/18161* (2013.01)
(58) Field of Classification Search
  CPC ..... H01L 2225/1023; H01L 2225/1041; H01L 2924/00; H01L 2924/00014; H01L 2924/15311; H01L 2924/00012; H01L 2924/0665; H01L 2924/207; H01L 2224/48227; H01L 2224/73265; H01L 2224/2919; H01L 2224/13099; H01L 2224/45015; H01L 2224/16238; H01L 2224/81191; H01L 23/49811; H01L 23/49816; H01L 23/49838; H01L 29/49861; H01L 23/485
  See application file for complete search history.

(56) References Cited

U.S. PATENT DOCUMENTS

| | | | |
|---|---|---|---|
| 5,072,520 A | 12/1991 | Nelson | |
| 5,118,540 A * | 6/1992 | Hutchison | B32B 7/02 359/360 |
| 5,167,992 A * | 12/1992 | Lin | H05K 3/244 216/13 |
| 5,302,456 A * | 4/1994 | Matsui | H01B 1/22 257/E21.511 |
| 5,329,695 A * | 7/1994 | Traskos | H05K 3/4617 156/89.17 |
| 5,544,469 A * | 8/1996 | Weder | A01G 5/04 53/399 |
| 5,773,386 A * | 6/1998 | Langan | G09F 3/10 427/152 |
| 6,147,408 A * | 11/2000 | Ogure | H01L 21/288 257/758 |
| 6,444,567 B1 * | 9/2002 | Besser | H01L 21/76849 257/E21.591 |
| 6,483,403 B2 * | 11/2002 | Hirabayashi | H01P 1/2039 333/204 |
| 6,613,671 B1 * | 9/2003 | Chopra | H01L 21/76849 257/E21.508 |
| 6,664,615 B1 | 12/2003 | Bayan et al. | |
| 6,689,689 B1 * | 2/2004 | Besser | H01L 21/76846 257/E21.592 |
| 6,872,661 B1 | 3/2005 | Kwan et al. | |
| 6,875,634 B2 * | 4/2005 | Shim | H01L 23/4334 257/E23.092 |
| 7,064,012 B1 | 6/2006 | Lin | |
| 7,397,124 B2 * | 7/2008 | Hu | H01L 21/76805 257/756 |
| 7,413,995 B2 | 8/2008 | Sterrett et al. | |
| 7,638,879 B2 | 12/2009 | Jiang et al. | |
| 7,671,452 B1 * | 3/2010 | Bayan | H01L 21/561 257/666 |
| 7,709,935 B2 | 5/2010 | Islam et al. | |
| 7,749,809 B2 | 7/2010 | How et al. | |
| 7,863,757 B2 | 1/2011 | How et al. | |
| 8,046,912 B2 | 11/2011 | Kubota et al. | |
| 8,097,490 B1 * | 1/2012 | Pagaila | H01L 21/561 257/E21.007 |
| 8,138,423 B2 | 3/2012 | Watanabe et al. | |
| 8,176,628 B1 | 5/2012 | Rusli et al. | |
| 8,735,224 B2 | 5/2014 | Do et al. | |
| 9,627,368 B2 * | 4/2017 | Kim | H01L 25/50 |
| 2001/0047880 A1 * | 12/2001 | Abbott | H01L 23/4985 174/254 |
| 2002/0027261 A1 * | 3/2002 | Besser | H01L 21/7684 257/584 |
| 2002/0115808 A1 * | 8/2002 | Peloquin | B32B 27/30 526/307.7 |
| 2003/0151067 A1 | 8/2003 | Iijima et al. | |
| 2003/0155638 A1 | 8/2003 | Ito | |
| 2005/0016764 A1 * | 1/2005 | Echigo | H05K 3/4069 174/256 |
| 2005/0282378 A1 * | 12/2005 | Fukunaga | C23C 16/042 438/622 |
| 2006/0141273 A1 * | 6/2006 | Kino | B32B 7/12 428/473.5 |
| 2006/0219565 A1 * | 10/2006 | Preusse | C25D 5/02 205/104 |
| 2007/0057169 A1 * | 3/2007 | Hsiao | H01L 27/14618 250/239 |
| 2007/0070575 A1 * | 3/2007 | Sekimoto | H01L 21/67051 361/234 |
| 2007/0079986 A1 | 4/2007 | Kikuchi et al. | |
| 2007/0080439 A1 | 4/2007 | Kikuchi et al. | |
| 2007/0164457 A1 | 7/2007 | Yamaguchi et al. | |
| 2007/0246821 A1 | 10/2007 | Lu et al. | |
| 2008/0079001 A1 * | 4/2008 | Umezaki | H01L 27/12 257/59 |
| 2008/0240656 A1 * | 10/2008 | Rollin | H01P 3/06 385/50 |
| 2008/0277783 A1 | 11/2008 | Kim et al. | |
| 2008/0277800 A1 * | 11/2008 | Hwang | H01L 23/481 257/777 |
| 2008/0284015 A1 * | 11/2008 | Robles | H01L 21/4853 257/737 |
| 2008/0285304 A1 * | 11/2008 | Rankin, Jr. | G02B 6/0036 362/602 |
| 2008/0305346 A1 * | 12/2008 | Yanagida | B32B 15/08 428/473.5 |
| 2009/0071704 A1 * | 3/2009 | Hsu | H05K 3/421 174/261 |
| 2009/0121730 A1 * | 5/2009 | Kimura | G01R 31/2805 324/724 |
| 2009/0223046 A1 | 9/2009 | Murayama et al. | |
| 2010/0003788 A1 | 1/2010 | Wang et al. | |
| 2010/0102426 A1 * | 4/2010 | Park | H01L 21/481 257/686 |
| 2010/0210745 A1 * | 8/2010 | McDaniel | C09D 5/008 521/55 |
| 2010/0213603 A1 | 8/2010 | Smeys et al. | |
| 2010/0270674 A1 * | 10/2010 | Zhu | H01L 23/522 257/758 |
| 2011/0001224 A1 | 1/2011 | San Antonio et al. | |
| 2011/0036912 A1 * | 2/2011 | Guo | G06K 19/07749 235/492 |
| 2011/0057325 A1 * | 3/2011 | Ishihara | H01L 23/3114 257/774 |
| 2011/0155433 A1 | 6/2011 | Funaya et al. | |
| 2011/0184363 A1 * | 7/2011 | Suzuki | A61F 13/15211 604/364 |
| 2011/0186992 A1 | 8/2011 | Wu et al. | |
| 2011/0198752 A1 | 8/2011 | Nondhasitthichai et al. | |
| 2011/0206910 A1 * | 8/2011 | Iwamoto | H05K 3/22 428/200 |
| 2011/0247865 A1 * | 10/2011 | Tsurumi | H05K 3/4661 174/255 |

(56) References Cited

U.S. PATENT DOCUMENTS

| | | | |
|---|---|---|---|
| 2011/0278741 A1 | 11/2011 | Chua et al. | |
| 2011/0298126 A1* | 12/2011 | Tsai | H01L 21/4832 257/738 |
| 2011/0309529 A1* | 12/2011 | Kim | H01L 22/20 257/783 |
| 2011/0316147 A1* | 12/2011 | Shih | H01L 21/486 257/737 |
| 2012/0086100 A1* | 4/2012 | Andry | H01L 21/2007 257/506 |
| 2012/0091569 A1 | 4/2012 | Appelt et al. | |
| 2012/0094442 A1* | 4/2012 | Lin | H05K 1/021 438/118 |
| 2012/0153463 A1* | 6/2012 | Maeda | H05K 1/115 257/737 |
| 2012/0164408 A1* | 6/2012 | Hwu | B32B 7/06 428/202 |
| 2012/0187545 A1* | 7/2012 | Khan | H01L 21/561 257/621 |
| 2012/0193785 A1* | 8/2012 | Lin | H01L 21/76229 257/737 |
| 2012/0267751 A1 | 10/2012 | Haba et al. | |
| 2012/0280390 A1 | 11/2012 | Do et al. | |
| 2012/0286419 A1 | 11/2012 | Kwon et al. | |
| 2013/0000968 A1* | 1/2013 | Zhao | H05K 3/184 174/266 |
| 2013/0026657 A1 | 1/2013 | Hsiao et al. | |
| 2013/0099372 A1 | 4/2013 | Kuechenmeister et al. | |
| 2013/0168857 A1 | 7/2013 | Gregorich et al. | |
| 2013/0182402 A1* | 7/2013 | Chen | H01L 23/49827 361/807 |
| 2013/0192880 A1* | 8/2013 | Nakanishi | H05K 1/0201 174/251 |
| 2014/0022638 A1* | 1/2014 | Wu | G02B 5/30 359/483.01 |
| 2014/0076614 A1* | 3/2014 | Kobayashi | H05K 1/0298 174/251 |
| 2014/0084480 A1* | 3/2014 | Wang | H01L 23/49827 257/774 |
| 2014/0113788 A1* | 4/2014 | Huang | H05K 3/007 493/128 |
| 2014/0124919 A1* | 5/2014 | Huang | H01L 21/76898 257/737 |
| 2014/0167234 A1* | 6/2014 | Hurwitz | H01L 21/563 257/668 |
| 2014/0168014 A1* | 6/2014 | Chih | H01L 24/19 343/700 MS |
| 2014/0264835 A1* | 9/2014 | Wang | H01L 23/49811 257/737 |
| 2015/0200337 A1* | 7/2015 | Denda | H05K 1/115 257/99 |
| 2015/0231858 A1* | 8/2015 | van Neer | B32B 7/12 428/201 |
| 2015/0348895 A1* | 12/2015 | Sen | H01L 23/145 257/774 |
| 2016/0044780 A1* | 2/2016 | Inagaki | H05K 1/0296 174/251 |

* cited by examiner

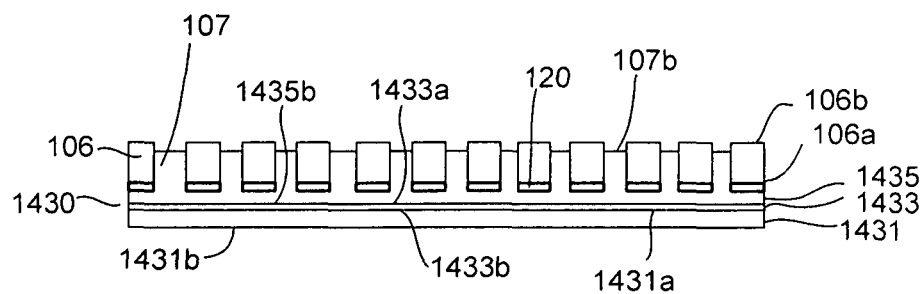
Fig. 12d
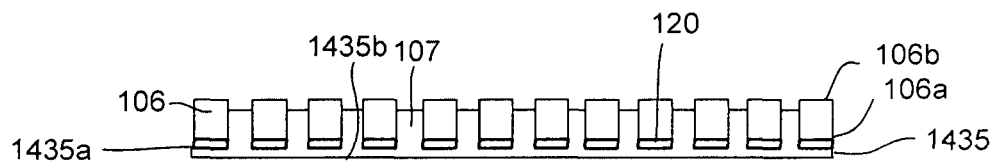
Fig. 12e
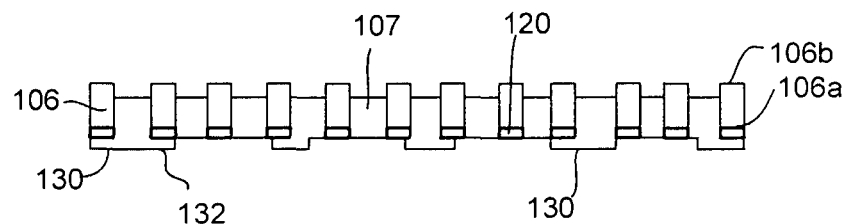
Fig. 12f$_i$
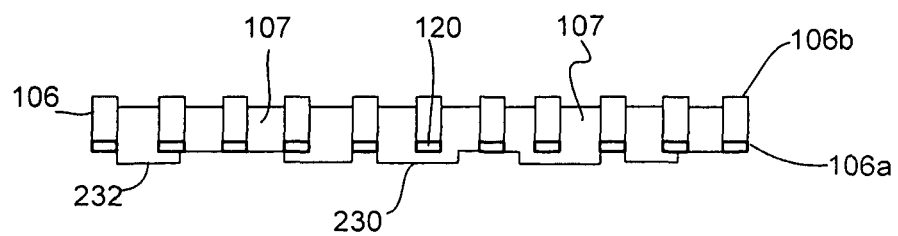
Fig. 12f$_{ii}$

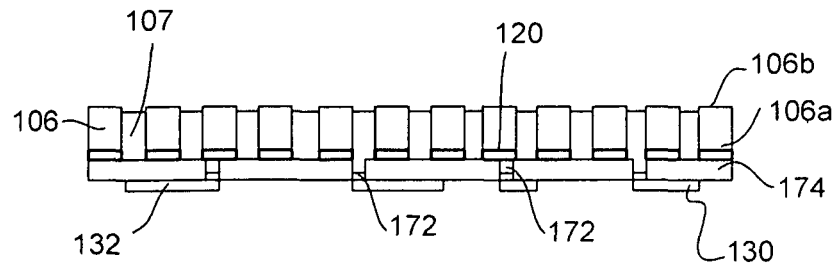
Fig. 13e
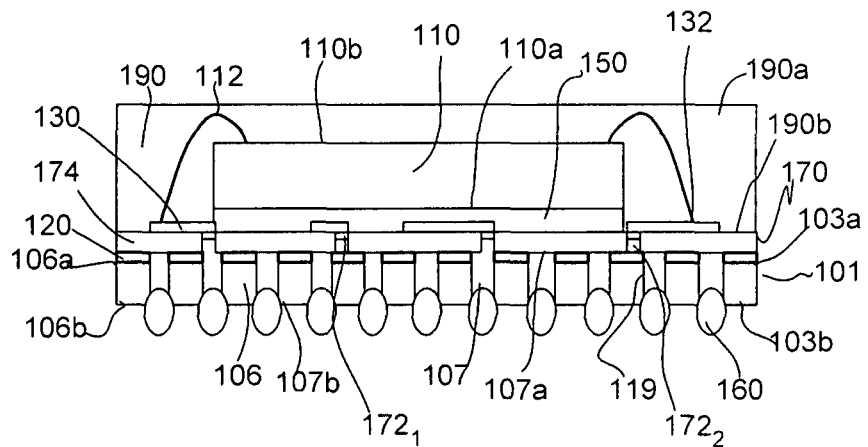
Fig. 13f$_i$
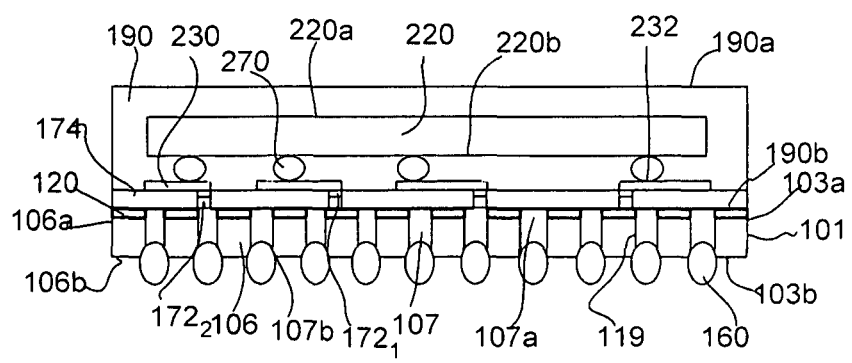
Fig. 13f$_{ii}$

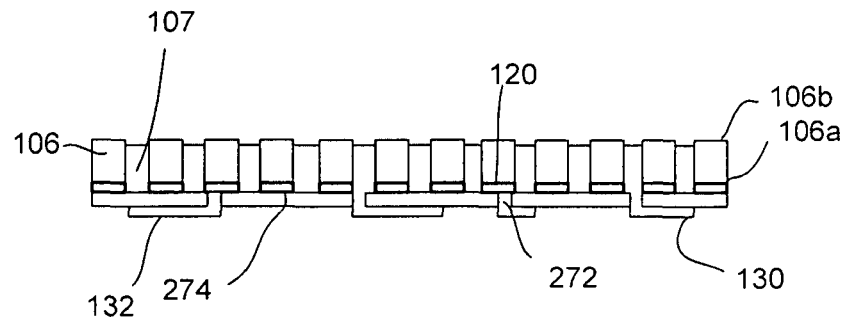
Fig. 14d
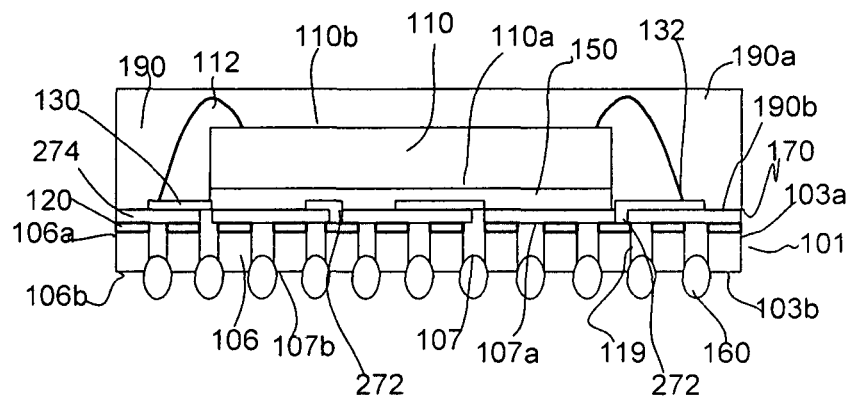
Fig. 14e$_i$
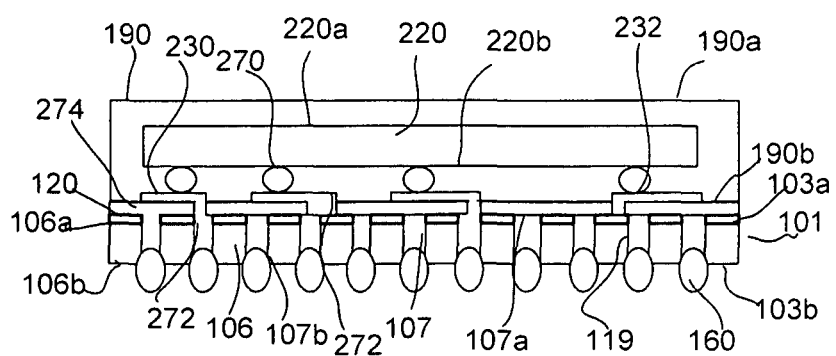
Fig. 14e$_{ii}$

SEMICONDUCTOR PACKAGES AND METHODS OF PACKAGING SEMICONDUCTOR DEVICES

CROSS-REFERENCE TO RELATED APPLICATION

This application is a divisional application of co-pending U.S. patent application Ser. No. 13/802,769 filed Mar. 14, 2013, the content of which is hereby incorporated by reference in its entirety for all purposes.

BACKGROUND

Ball grid array (BGA) packages, thermal leadless array (TLA) packages and leadframe-based packages, such as high density leadframe array (HLA) packages, are popular packaging solutions for high I/O devices in the industry. However, existing BGA, TLA and leadframe-based packages suffer from several disadvantages. For example, BGA may offer high pin counts, however, the cost for producing BGA is relatively costly and the thermal performance of the BGA packages requires improvement. On the other hand, there is a need to increase the robustness and reliability of the TLA packages, for example, in terms of lead pull strength and die pad drop, etc. While leadframe-based packages, such as HLA, provide an economical alternative, the process for producing HLA packages is not easy and the package level reliability is limited.

From the foregoing discussion, there is a desire to provide an improved package having very thin package profile, higher I/O counts, fine pitch and flexible routings and with enhanced electrical and thermal performance. It is also desirable to provide simplified methods to produce a reliable package with relatively low cost and which can be flexibly customizable according to design requirements.

SUMMARY

Embodiments relate generally to semiconductor packages. In one embodiment, a method for forming a semiconductor package is disclosed. The method includes providing a package substrate having first and second major surfaces. The package substrate includes a base substrate having a mold material and a plurality of interconnect structures including via contacts extending through the first to the second major surface of the package substrate. A die having conductive contacts on its first or second surface is provided. The conductive contacts of the die are electrically coupled to the interconnect structures. A cap is formed over the package substrate to encapsulate the die.

In another embodiment, a semiconductor package is presented. The semiconductor package includes a package substrate having first and second major surfaces. The package substrate includes a base substrate having a mold material and a plurality of interconnect structures including via contacts extending through the first to the second major surface of the package substrate. A die having conductive contacts on its first or second surfaces is disposed on the package substrate. The conductive contacts of the die are electrically coupled to the interconnect structures. A cap is disposed over the package substrate and encapsulates the die.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 10a-j, FIGS. 11a-d, FIGS. 12a-f, FIGS. 13a-f, FIGS. 14a-e, FIGS. 15a-h and FIGS. 16a-g show various embodiments of a method for forming a semiconductor package.

DESCRIPTION

Embodiments relate to semiconductor packages and methods for forming a semiconductor package. The packages are used to package one or more semiconductor dies or chips. For the case of more than one die, the dies may be arranged in a planar arrangement, vertical arrangement, or a combination thereof. The dies, for example, may include memory devices, logic devices such as mixed signal logic devices, communication devices, RF devices, optoelectronic devices, digital signal processors (DSPs), microcontrollers, system-on-chips (SOCs) as well as other types of devices or a combination thereof. Such packages may be incorporated into electronic products or equipment, such as phones, computers as well as mobile and mobile smart products. Incorporating the packages into other types of products may also be useful.

Figure 1:
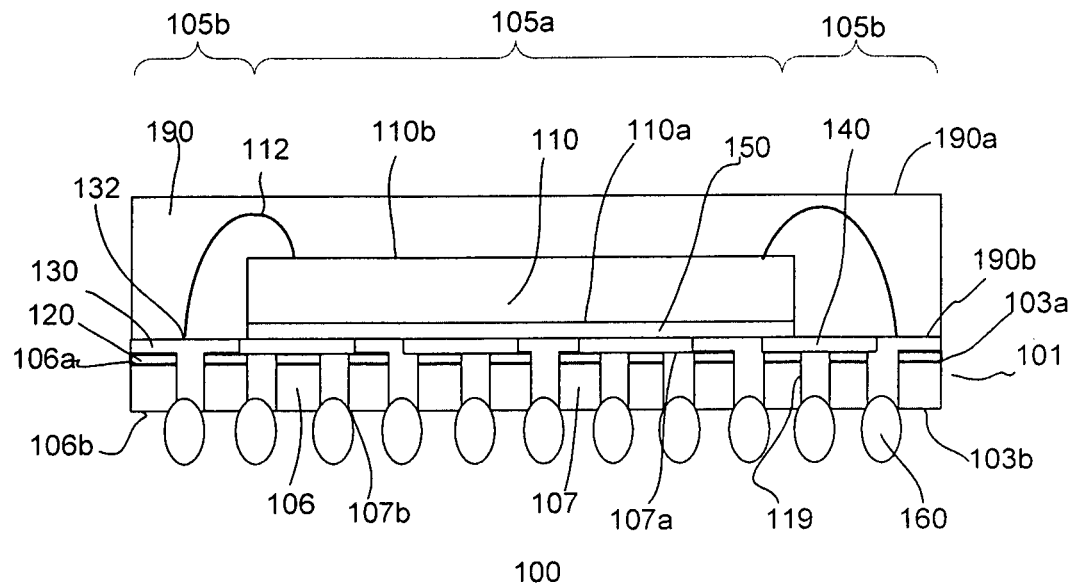
FIGS. 1-3 show various embodiments of a semiconductor package.
Figure 2:
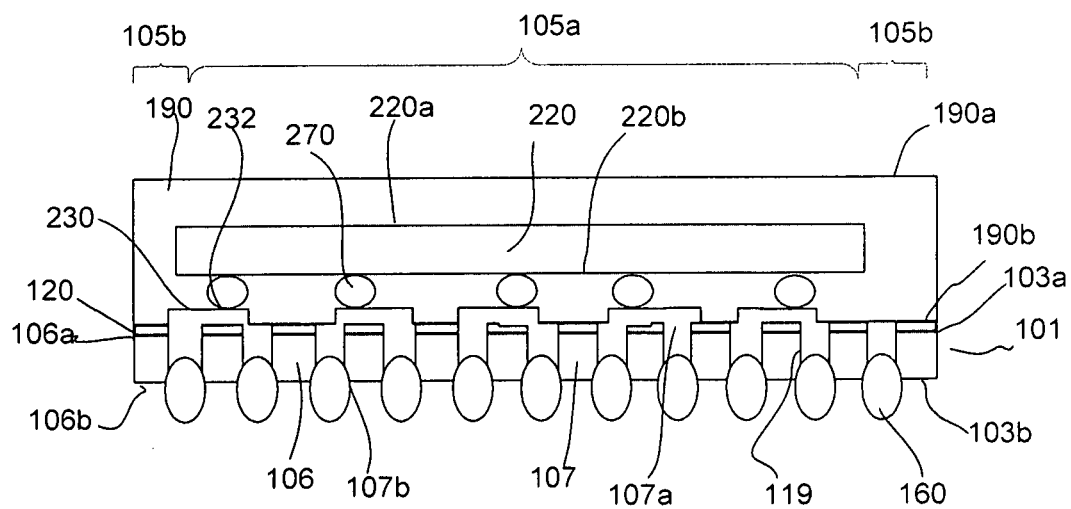
Figure 3:
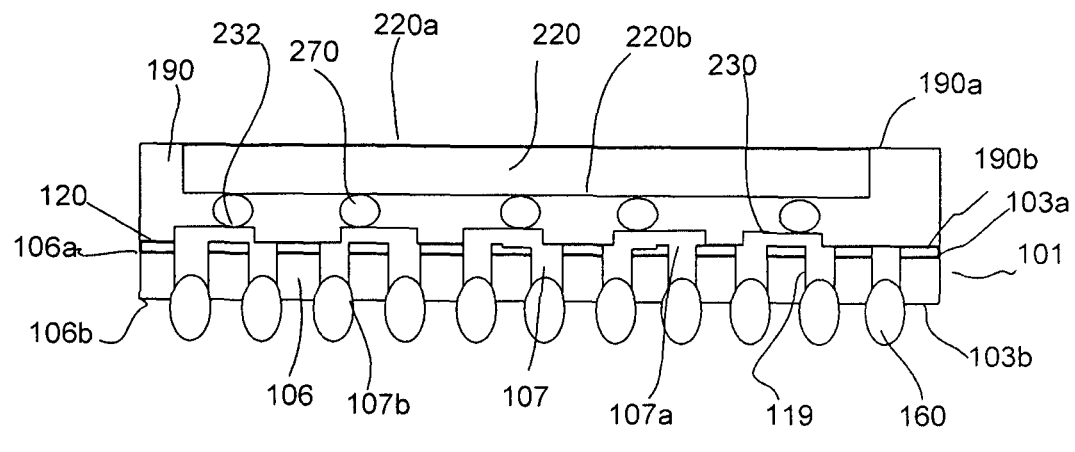

FIGS. 1-3 show simplified cross-sectional views of different embodiments of a semiconductor package. The semiconductor package 100, as shown in FIG. 1, includes a package substrate 101. The package substrate includes first and second major surfaces. The first major surface 103a, for example, may be referred to as the top surface and the second major surface 103b, for example, may be referred to as the bottom surface. Other designations for the surfaces may also be useful. In one embodiment, the first major surface of the package substrate includes first and second regions. The first region 105a, for example, is a die or chip region on which a die is mounted and the second region 105b, for example, is a non-die region. In one embodiment, the non-die region surrounds the die region. The die region, for example, may be disposed in a central portion of which the die is mounted and a non-die region which is outside of the die region. The die region, for example, may be concentrically disposed within the periphery of the package substrate. Other configurations of die and non-die regions may also be useful.

In one embodiment, the package substrate includes a base substrate 106 and a plurality of via contacts 107 extending from the first to the second major surface of the package substrate. In one embodiment, the base substrate includes a mold compound, such as molding epoxy resin material. The base substrate may be formed of other suitable types of substrate materials. The base substrate, for example, may be sufficiently thin or may include any suitable thickness, depending on manufacturing capabilities. The base substrate includes first and second major surfaces 106a-b, defining the first and second major surfaces of the package substrate. The base substrate, in one embodiment, is a patterned or pre-defined mold substrate having a plurality of cavities or vias 119 accommodating the plurality of via contacts.

The via contacts, in one embodiment, are formed of a single conductive material. For example, the via contacts may be formed of copper. Other suitable types of conductive materials may also be useful. The via contacts, in another embodiment, may be formed of two or more conductive materials, forming a multi-layered stack. The multi-layered stack, for example, may include copper, nickel, gold, silver, alloys, or a combination thereof. Other suitable types of conductive materials may also be useful. The via contacts may have tapered or straight profiles. The via contacts, for example, are held together and surrounded by the base substrate. The via contacts, as shown, are isolated from each other by the base substrate. It is understood that via contacts may also be disposed at the peripheries of the package substrate.

The via contacts include first and second surfaces 107a-b. The second surface 107b of the via contacts, in one embodiment, is substantially coplanar with the second surface 106b of the base substrate. In another embodiment, the second surface of the via contacts is non-coplanar with the second surface of the base substrate. For example, the second surface of the via contacts may be above or below the second surface of the base substrate.

In one embodiment, an adhesive 120 is disposed on the first surface 106a of the base substrate. The adhesive, for example, includes a UV sensitive laminate material or a thermal sensitive laminate material. Other suitable types of adhesive material may also be used. The adhesive may be in different forms. For example, the adhesive may be a tape, a liquid or a paste.

In one embodiment, conductive traces 130 and connection pads 132 are disposed on the adhesive layer 120 over the base substrate and the first surface 107a of the via contacts. The conductive traces 130 and connection pads 132 are coupled to the via contacts forming interconnects of the package substrate which are coupled to die pads of a die. The conductive traces and connection pads, in one embodiment, are formed of the same conductive material as the via contacts, such as copper. In another embodiment, the conductive traces and connection pads may be formed of a different material than the via contacts. The conductive traces and connection pads, for example, may be formed of a monolithic conductive material. Other suitable types of conductive material may also be useful. The thickness of the conductive traces or connection pads, for example, may be as low as about 10 μm. Other suitable thicknesses may also be useful.

An insulating layer 140 may optionally be disposed in between the conductive traces. The insulating layer, for example, isolates the conductive traces. The insulating layer, for example, includes a dielectric material such as a solder mask or inorganic insulating film material. Other suitable types of dielectric material may also be used.

In one embodiment, an adhesive layer 150 may be used to mount a die 110 to the package substrate. The die can be a semiconductor die or chip. The die includes first and second major surfaces. The first surface 110a, for example, is an inactive surface of the die and the second surface 110b is an active surface of the die. Other designations for the surfaces of the die may also be useful. The active surface, for example, includes openings (not shown) in a final passivation layer to expose conductive die pads/contacts (not shown). The surfaces of the die pads, for example, are substantially coplanar with the second major surface of the die. Providing surfaces of the conductive pads which are not coplanar with the second major surface of the die may also be useful. The die pads provide connections to the circuitry of the die. The die pads, for example, are formed of a conductive material, such as copper, aluminum, gold, nickel or alloys thereof. Other types of conductive material may also be used for the die pads. The pattern of the die pads may be one or more rows disposed at the periphery of the active surface. Other pad patterns may also be useful.

The inactive surface of the die is mounted to the die region of the package substrate with the use of the adhesive layer 150. The adhesive layer, for example, may include an adhesive paste or die attach film; such as tape. Other types of adhesive, such as epoxy, may also be useful. In one embodiment, wire bonds 112 are provided to couple the die pads on the die to the conductive traces. The wire bonds create electrical connection between the conductive traces of the package substrate and die pads on the die.

In one embodiment, a cap 190 is disposed on top of the package substrate, encapsulating the die and the wire bonds. The cap serves to protect the die from the environment. For example, the cap may protect the die from moisture. The cap, for example, is formed of an encapsulation material. The encapsulation material, for example, may include molding epoxy resin material. Other suitable types of encapsulation materials may also be useful.

The cap includes first and second major surfaces 190a-b. The first surface 190a, for example, may be the top surface and the second surface 190b may be the bottom surface. Other designations for the surfaces of the cap may also be useful. In one embodiment, the cap surrounds and covers the die and the wire bonds. The bottom surface of the cap 190b, in one embodiment, may contact the conductive traces 130, connection pads 132, insulating layer 140 and the adhesive 120 of the package substrate. As shown in FIG. 1, the second surface of the cap is separated from the base substrate of the package substrate by the conductive traces 130, connection pads 132 and insulating layer 140.

Package contacts 160 are disposed on the second surface of the via contacts. The package contacts, for example, are spherical shaped structures or balls. The package contacts protrude from the bottom surface of the package substrate. Providing package contacts which do not protrude from the bottom surface of the package substrate, such as solder lands, may also be useful. The package contact is formed of a conductive material. The package contacts, for example, can be formed from solder. Various types of solder can be used to form the package contacts. For example, the solder can be a lead-based or non lead-based solder. Other types of conductive materials may also be used to form the package contacts.

The package contacts provide external access to the die via the conductive traces, via contacts and die pads. The package may be electrically coupled to an external device (not shown), such as a circuit board, by the package contacts.

FIG. 2 shows another embodiment of a semiconductor package 200. The semiconductor package 200 is similar to that described in FIG. 1. For example, the package substrate 101 includes a plurality of via contacts 107 held together and surrounded by the base substrate 106. An adhesive 120 is disposed on the first surface of the base substrate and package contacts 160 are disposed on the second surface 107b of the via contacts, similar to that described in FIG. 1. As such, common elements may not be described or described in detail.

In one embodiment, conductive traces 230 and connection pads 232 are disposed on the adhesive 120 over the base substrate and the first surface 107a of the via contacts. The conductive traces 230 and connection pads 232, in one embodiment, are formed of the same conductive material as the via contacts, such as copper. In another embodiment, the conductive traces and connection pads may be formed of a different material than the via contacts. The conductive traces and connection pads, for example, may be formed of a monolithic conductive material. Other suitable types of conductive material may also be useful. The thickness of the conductive traces or connection pads, for example, may be as low as about 10 μm. Other suitable thicknesses may also be useful.

In one embodiment, a flip chip 220 is mounted on the die region of the package substrate, as shown in FIG. 2. The flip chip, for example, includes inactive and active surfaces 220a-b. Die contacts 270 are disposed on the active surface 220b of the die. The connection pads 232, in one embodiment, are disposed in the die region of the package substrate. The connection pads 232, as shown, are configured to match the pattern of the die contacts of the flip chip. The conductive traces 230 and connection pads 232 thus couple the die contacts of the flip chip to the via contacts of the package substrate. The conductive traces and connection pads and the via contacts form interconnect structures of the package substrate. An underfill (not shown), such as an epoxy-based polymeric material, may be provided in the space between the die and package substrate. Alternatively, no underfill is provided between the die and package substrate.

In one embodiment, a cap 190 is disposed on top of the package substrate, encapsulating the flip chip. The cap serves to protect the flip chip from the environment. The cap, for example, is formed of an encapsulation material. The encapsulation material, for example, may include molding epoxy resin material. Other types of encapsulation materials may also be useful.

In one embodiment, the cap covers and surrounds the flip chip and the die contacts. The second surface 190b of the cap, in one embodiment, contacts the adhesive 120 on the base substrate 106 of the package substrate and/or the first surface 107a of the via contacts. As shown in FIG. 2, the second surface 190b of the cap is separated from the base substrate of the package substrate by the adhesive 120 on the base substrate.

In another embodiment, the cap surrounds the sides of the flip chip, leaving the inactive surface 220a of the flip chip exposed as shown in FIG. 3. As such, the first surface 190a of the cap is substantially coplanar with the inactive surface of the flip chip. By providing a cap which does not cover the inactive surface of the die helps improves the heat dissipation from the die. External heat sink (not shown) may also be attached to the inactive surface of the die to further improve heat dissipation.

As described in the embodiments of FIGS. 1-3, the second surface of the cap is separated from the base substrate of the package substrate by the adhesive and/or the conductive traces and connection pads. Moreover, as presented, the package substrate includes a plurality of via contacts held together and surrounded by the base substrate. As such, the via contacts will not be detached easily. This allows for improved robustness and reliability, such as enhanced lead pull strength, die pad drop, etc., relative to other types of packages, such as thermal leadless array (TLA). The use of molding material as the material for the base substrate also provides a cost saving solution relative to laminate base substrates. Furthermore, the second surface of the via contacts, in one embodiment, is disposed below or recessed with respect to the second surface of the base substrate. Such configuration is advantageous as it provides recesses or pockets for better receiving of package contacts. The package substrate, as described for example in FIG. 1, includes via contacts in the die and non-die regions. As such, the package substrate serves as fan-in and fan-out redistribution structure for the die contacts, enabling redistributed external package connections. The semiconductor package, as described in FIG. 3 may have improved thermal performance as the inactive surface of the flip is exposed for dissipating heat. Moreover, such configuration also allows for inclusion of additional heat sink or heat spreader to further enhance heat dissipation.

Figure 4:
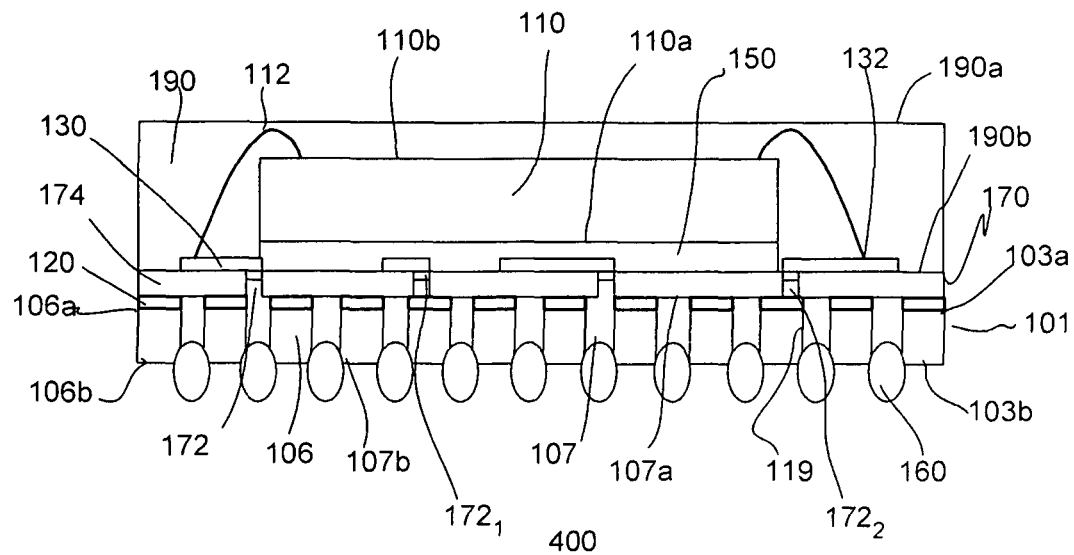
FIGS. 4-9 show various other embodiments of a semiconductor package.
Figure 5:
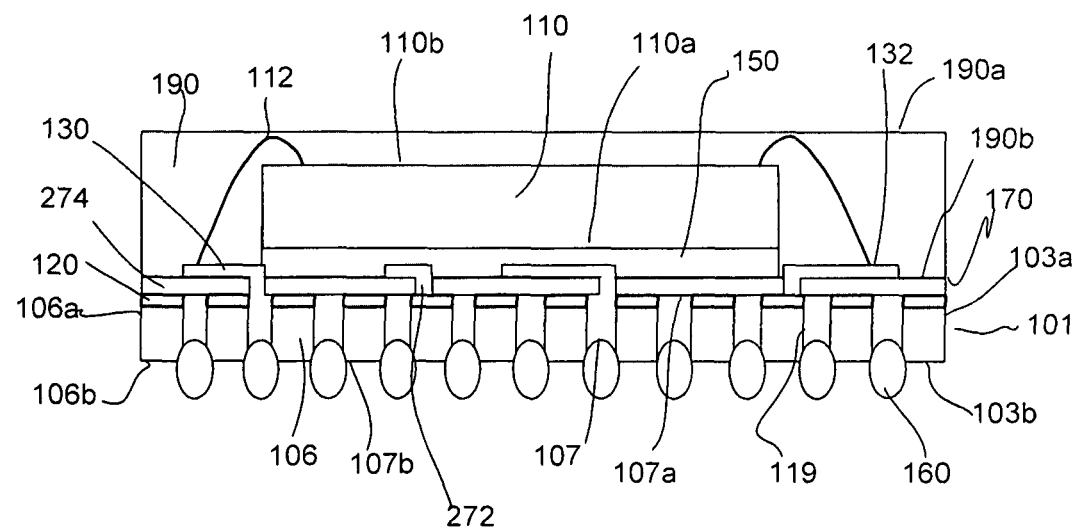

FIGS. 4 and 5 show various other embodiments of a semiconductor package. The semiconductor packages 400-500 of FIGS. 4 and 5 are similar to that described in FIG. 1. For example, the package substrate 101 includes a plurality of via contacts 107 held together and surrounded by the base substrate 106. An adhesive 120 is disposed on the first surface of the base substrate and package contacts 160 are disposed on the second surface 107b of the via contacts, similar to that described in FIG. 1. As such, common elements may not be described or described in detail.

In one embodiment, the package substrate includes further interconnect level 170. The package substrate includes a plurality of conductive studs 172 or 272 over the via contacts as shown in FIGS. 4 and 5. The conductive studs, for example, may be formed over the center of the via contacts. The studs, for example, may also be formed over the via contacts at regions other than the center region of the via contacts. In one embodiment, the conductive studs 272 include a single layer as shown in FIG. 5. The conductive studs 272, in one embodiment, include the same conductive material as the via contacts. For example, the conductive studs include a copper layer. Other suitable types of conductive material such as different than the material of the via contacts may also be useful. The width and thickness of the conductive studs 272 are smaller than or equal to the width and thickness of the via contacts. Other suitable widths and thicknesses may also be useful.

In another embodiment, the conductive studs 172 may be formed of two or more conductive materials, forming a multi-layered stack as shown in FIG. 4. The multi-layered stack, for example, may include copper, nickel or a combination thereof. Other types of conductive materials may also be useful. The multi-layered stack, for example, includes a first conductive layer $172_1$ and a second conductive layer $172_2$ below the first conductive layer. The multi-layered stack may include more than two layers. In one embodiment, the second conductive layer $172_2$ contacts the via contacts. The second conductive layer $172_2$, for example, includes a copper layer while the first conductive layer $172_1$ includes a nickel layer. Other suitable types of conductive materials may also be useful. The width and thickness of the conductive studs 172 are smaller than or equal to the width and thickness of the via contacts. Other suitable widths and thicknesses may also be useful.

In one embodiment, the package substrate further includes an insulating layer 174 or 274 disposed over the adhesive 120 on the base substrate 106 and the first surface 107a of the via contacts, filling the spaces between the conductive studs 172 or 272 as shown in FIGS. 4-5. The insulating layer 174 or 274 provides insulation between the conductive studs. In one embodiment, the insulating layer includes a dielectric material such as solder mask or inorganic insulating film. The insulating layer, in one embodiment, includes a material different than that of the base substrate. Other types of dielectric materials, such as the same as the material of the base substrate, may also be useful. As shown in FIGS. 4-5, the insulating layer 174 or 274 is formed around the conductive studs 172 or 272. The thickness of the insulating layer 174 or 274, for example, may be substantially the same as or lesser than the thickness of the conductive studs 172 or 272.

In one embodiment, conductive traces 130 and connection pads 132 are disposed on the insulating layer 174 and top surfaces of the conductive studs. The conductive traces 130 or connection pads 132 may be extended from the side surfaces of the conductive studs 172 or 272. In cases where the conductive studs 172 include a multi-layered stack, the conductive traces 130 or connection pads 132 may extend from the two or more layers of the multi-layered stack of the conductive studs 172. The conductive traces 130 and connection pads 132, in one embodiment, are formed of the same material as the conductive studs, such as copper as shown in FIG. 5. Other types of conductive material, such as materials different than that of the conductive studs as shown in FIG. 4, may also be useful. The thickness of the conductive traces, for example, may be as low as about 10 μm. In one embodiment, the conductive traces are electrically coupled to the conductive studs which are coupled to the via contacts forming interconnects of the package substrate as shown in FIGS. 4-5.

A die 110 is mounted to the package substrate by an adhesive layer 150, similar to that described in FIG. 1. For example, wire bonds 112 are provided to couple the die pads on the die to the conductive traces 130 at the non-die region of the package substrate which are coupled to the conductive studs 172 or 272 and to the via contacts 107 as shown in FIGS. 4-5. As such, features of the die will not be described or described in detail.

In one embodiment, a cap 190 is formed over the insulating layer 174 or 274, encapsulating the die 110 and the wire bonds 112. In one embodiment, the cap surrounds and covers the die and the wire bonds. The second surface 190b of the cap, in one embodiment, contacts the insulating layer 174 or 274 and/or the conductive traces 130. As shown in FIGS. 4-5, the second surface 190b of the cap is separated from the base substrate 106 of the package substrate by the adhesive 120 and the insulating layer 174 or 274.

Figure 6:
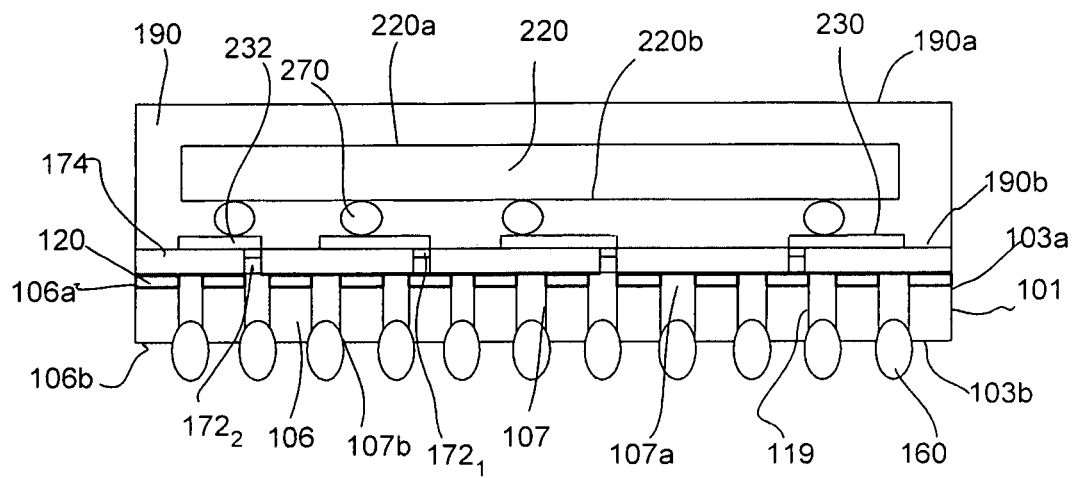
Figure 7:
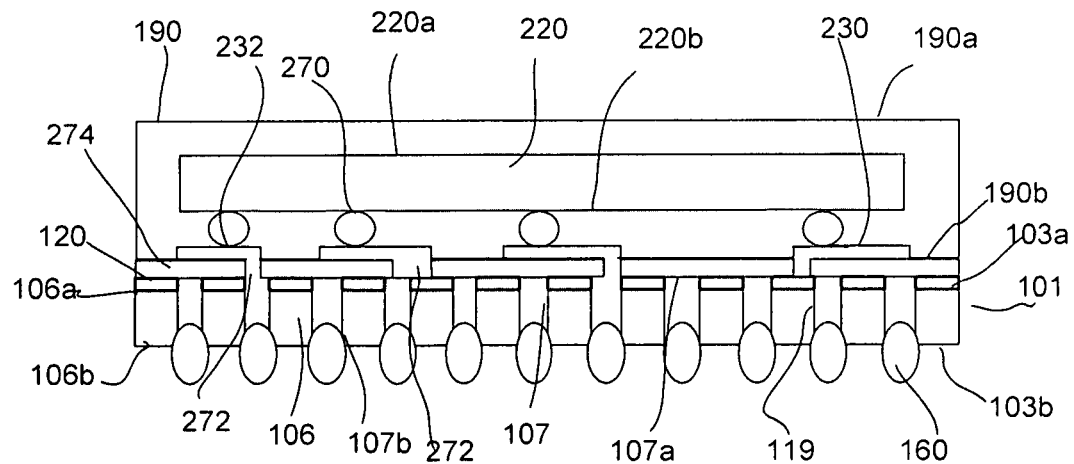

FIGS. 6-7 show various other embodiments of a semiconductor package. The semiconductor packages 600-700 are similar to that described in FIGS. 4-5. As such, common elements may not be described or described in detail.

In one embodiment, conductive traces 230 and connection pads 232 are disposed on the insulating layer 174 or 274. The thickness of the conductive traces and connection pads, for example, is about 10 μm. The conductive traces and connection pads are electrically coupled to the conductive studs 172 or 272 which are coupled to the via contacts 107 forming interconnects of the package substrate. The conductive traces and connection pads, in one embodiment, are disposed in the die region of the package substrate.

In one embodiment, a flip chip 220 similar to that described in FIGS. 2-3 is mounted on the die region of the package substrate, as shown in FIGS. 6-7. Die contacts 270, for example, are disposed on the active surface 220b of the die. The connection pads 232, as shown, are configured to match the pattern of the die contacts of the flip chip. The conductive traces 230 and connection pads 232 thus couple the die contacts 270 of the flip chip to the conductive studs 172 or 272 and to the via contacts 107 of the package substrate.

A cap 190 is formed over the insulating layer 174 or 274, encapsulating the flip chip. The cap serves to protect the flip chip from the environment. In one embodiment, the cap covers and surrounds the flip chip and the die contacts. The second surface of the cap 190b, in one embodiment, contacts the insulating layer 174 or 274 and/or the conductive traces 230 and connection pads 232. As shown in FIGS. 6-7, the second surface 190b of the cap is separated from the base substrate of the package substrate by the insulating layer 174 or 274 and the adhesive 120 on the base substrate.

In another embodiment, the cap surrounds the sides of the flip chip, leaving inactive surface of the flip chip exposed (not shown). As such, the first surface 190a of the cap is coplanar with the top or inactive surface of the flip chip. External heat sink may also be attached to the inactive surface of the die to further improve heat dissipation.

The embodiments described with respect to FIGS. 4-7 include some or all advantages as described with respect to FIGS. 1-3. As such, these advantages will not be described or described in detail. The package substrate as described in the embodiments of FIGS. 4-7 includes further interconnect level which includes conductive studs. The width of the conductive studs in one embodiment, as described, is smaller than the width of the via contacts. The conductive studs as described need not be formed at the center of the via contacts and its smaller width relative to the via contacts provide allowance for more traces, leading to more flexible and efficient routability of traces. Moreover, electrical resistance is lowered particularly where the interconnect structure of the package substrate, including the conductive traces, studs and via contacts, is formed of a single low electrical resistance material, such as copper. This further enhances the performance of the semiconductor packages.

Figure 8:
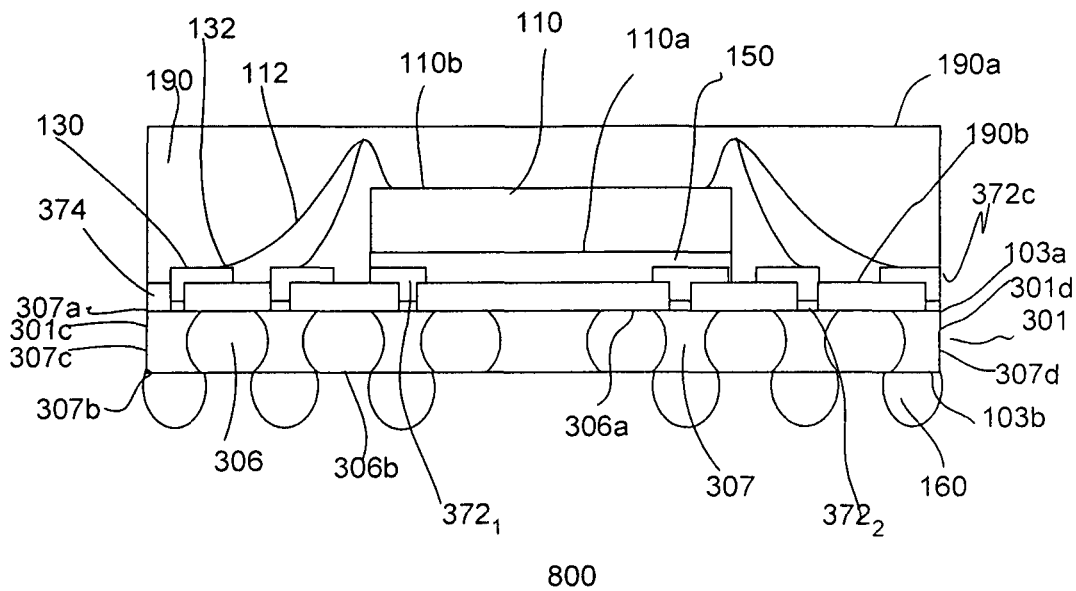
Figure 9:
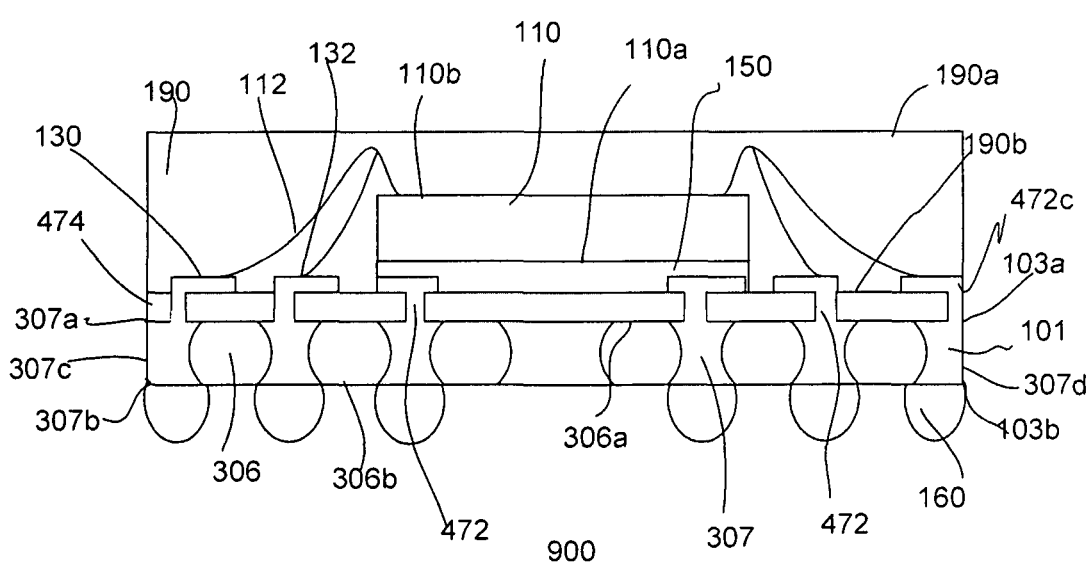

FIGS. 8-9 show various other embodiments of a semiconductor package. The semiconductor packages 800-900 are similar to that described in FIGS. 1-3 and 4-7. As such, common elements may not be described or described in detail.

In one embodiment, the package substrate 301 includes a base substrate 306 and a plurality of via contacts 307 extending from the first to the second major surface of the package substrate. The base substrate 306, in one embodiment, includes a mold compound, such as molding epoxy resin material. The via contacts 307 are formed of a conductive material. For example, the via contacts may be formed of a monolithic conductive material. The conductive material, for example, includes copper. Other suitable types of conductive materials may also be useful. The via contacts 307 are held together and isolated from each other by the base substrate 306. Package contacts 160 are disposed on the second surface 307b of the conductive via contacts.

In one embodiment, via contacts 307 are disposed at the peripheries 301c-d of the package substrate. As shown in FIGS. 8-9, side surfaces 307c-d of the conductive via contacts at the peripheries of the package substrate are exposed. In one embodiment, the first and second surfaces 307a-b of the via contacts and first and second surfaces 306a-b of the base substrate are substantially coplanar with each other. Providing first and second surfaces of the via contacts which are non-coplanar with first and second surfaces of the base substrate may also be useful.

In one embodiment, the package substrate includes further interconnect level. The package substrate includes a plurality of conductive studs 372 or 472 over and coupled to the via contacts 307 as shown in FIGS. 8-9. The conductive studs 372 or 472, in one embodiment, are disposed in the die and non-die regions of the package substrate. The conductive studs 372 or 472, in one embodiment, may also be provided on the via contacts 307 at the periphery 301d of the package substrate. As such, side surfaces 372c or 472c of the conductive studs disposed over the via contacts at the periphery of the package substrate are exposed.

In one embodiment, the conductive studs 472 include a single layer as shown in FIG. 9. The conductive studs 472, in one embodiment, include the same conductive material of the via contacts. For example, the conductive studs include copper. Other suitable types of conductive material such as different than the material of the via contacts may also be useful. The width and thickness of the conductive studs 472 are lesser than or equal to the width and thickness of the via contacts. Other suitable widths and thicknesses may also be useful.

In another embodiment, the conductive studs 372 may be formed of two or more conductive materials, forming a multi-layered stack as shown in FIG. 8. The multi-layered slack, for example, may include copper, nickel or a combination thereof. Other types of conductive materials may also be useful. The multi-layered stack, for example, includes a first conductive layer $372_1$ and a second conductive layer $372_2$ below the first conductive layer. The multi-layered stack may include more than two layers. In one embodiment, the second conductive layer $372_2$ contacts the via contacts. The second conductive layer $372_2$, for example, includes a nickel layer while the first conductive layer $372_1$ includes a copper layer. Other suitable types of conductive materials may also be useful. The first and second conductive layers may include any suitable thicknesses and conductive materials, depending on the desired electrical properties to suit the required applications.

In one embodiment, the package substrate further includes an insulating layer 374 or 474 disposed over the top surfaces of the via contacts and the base substrate, filling the spaces between the conductive studs 372 or 472 as shown in FIGS. 8-9. The insulating layer provides insulation between the conductive studs. In one embodiment, the insulating layer includes a dielectric material, such as solder mask or inorganic insulating film. The insulating layer, in one embodiment, includes a material different than that of the base substrate. Other types of dielectric materials may also be useful. As shown in FIGS. 8-9, the insulating layer is formed around the conductive studs. The thickness of the insulating layer 374 or 474, for example, may be substantially the same as or lesser than the thickness of the conductive studs 372 or 472.

In one embodiment, conductive traces 130 and connection pads 132 are disposed on the insulation layer 374 or 474 as shown in FIGS. 8-9. The conductive traces 130 or connection pads 132 may be extended from the side surfaces of the conductive studs 372 or 472. In cases where the conductive studs 372 include a multi-layered stack, the conductive traces 130 or connection pads 132 may extend from the two or more layers of the multi-layered stack of the conductive studs 372. The conductive traces 130 and connection pads 132, in one embodiment, are formed of the same material as the conductive studs, such as copper. Other types of conductive material, such as materials different than that of the conductive studs, may also be useful. The thickness of the conductive traces, for example, may be as low as about 10 μm. In one embodiment, the conductive traces 130 and the connection pads 132 are electrically coupled to the conductive studs 372 or 472 which are coupled to the via contacts 307 forming interconnects of the package substrate as shown in FIGS. 8-9.

A die 110 is mounted to the package substrate by an adhesive layer 150, similar to that described in FIG. 1. For example, wire bonds 112 are provided to couple the die pads on the die to the conductive traces 130 at the non-die region of the package substrate which are coupled to the conductive studs 372 or 472 and to the via contacts 307 as shown in FIGS. 8-9. As such, features of the die will not be described or described in detail.

In one embodiment, a cap 190 is formed over the insulating layer 374 or 474, encapsulating the die 110 and the wire bonds 112. In one embodiment, the cap surrounds and covers the die and the wire bonds. The second surface 190b of the cap, in one embodiment, contacts the insulating layer 374 or 474 and/or the conductive traces 130. As shown in FIGS. 8-9, the second surface 190b of the cap is separated from the base substrate 306 of the package substrate by the insulating layer 374 or 474.

The semiconductor packages, as shown in FIGS. 8-9, include a wire bonded die. In another embodiment, the semiconductor packages may include a flip chip die, similar to that described in FIGS. 2-3 and 6-7. It is understood that modifications may be made to form conductive bumps as already described for the flip chip applications. As such, common elements may not be described or described in detail.

The embodiments described with respect to FIGS. 8-9 include some or all advantages as described with respect to FIGS. 1-7. As such, these advantages will not be described or described in detail. The package substrate as described in the embodiments of FIGS. 8-9 includes further advantages. For example, the interconnect structures of the package substrate, including the via contacts, conductive studs and conductive traces, are disposed at the peripheries of the package substrate. As such, side surfaces of the interconnect structures at the peripheries of the package substrate are exposed. Such configuration improves the thermal performance of the package.

The embodiments, as described in FIGS. 1-9, show a semiconductor package having a wire bonded type of die or a flip chip type of die. It is understood that other suitable types of dies, such as TSV type of dies and microelectromechanical systems chips, may also be useful. The semiconductor packages, as illustrated in FIGS. 1-9, include a single die. It is understood that the semiconductor package, may also include a die stack (not shown). The die stack includes x number of dies, where x is ≥2. In addition, it is understood that the dies of the die stack may be the same size or type. Providing a die stack having chips which are different types and/or sizes is also useful.

Figure 10A:
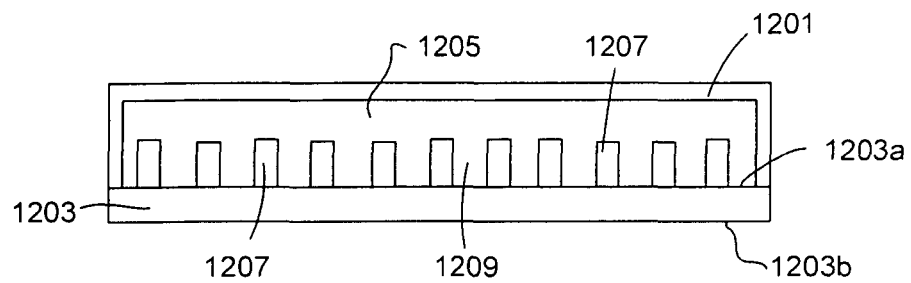

FIGS. 10a-j show an embodiment of a method for forming a semiconductor package. A first mold chase 1201 and a second mold chase 1203 are provided as shown in FIG. 10a. The first mold chase, in one embodiment, includes a cavity 1205 while the second mold chase, in one embodiment, is prepared with a plurality of protrusions 1207 and cavities 1209 in between the protrusions. In another embodiment, the first mold chase is prepared with a plurality of protrusions and cavities in between the protrusions while the second mold chase includes a cavity. As shown in FIG. 10a, a plurality of protrusions are predefined on a first surface 1203a of the second mold chase. The height of the protrusions may be varied, for example, depending on a desired thickness of a package substrate to be formed later. Other suitable dimensions for the height of the protrusion may also be useful. In one embodiment, the protrusions include straight sidewalls. In other embodiments, the protrusions may include tapered sidewalls. Providing other sidewall profiles for the protrusions may also be useful. The first and second mold chases, when assembled, form upper and lower cavities which define the shape of a base substrate of a package substrate to be formed later.

Figure 10B:
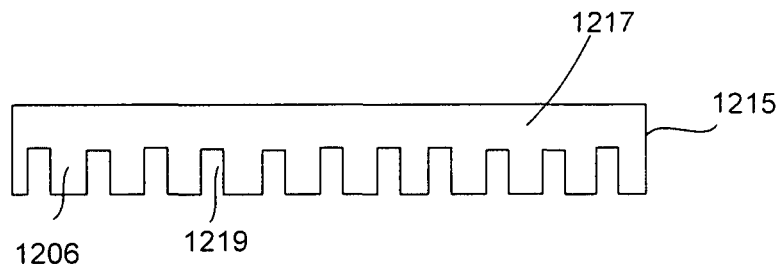
Figure 10C:
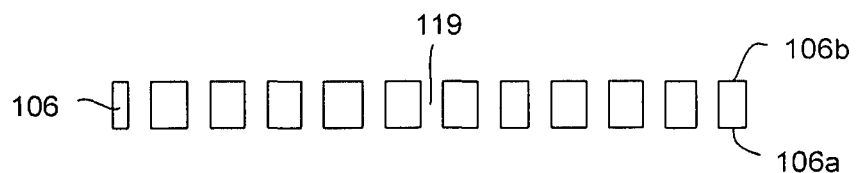

A substrate material is dispensed into the mold chase assembly, filling the spaces or cavities between the first and second mold chases to form a molded structure 1215. In one embodiment, the substrate material includes a mold compound, such as molding epoxy resin material. Providing other suitable types of substrate materials may also be useful. After molding, the molded structure 1215 is separated from the mold chases as shown in FIG. 10*b*. The molded structure, as shown, includes a base 1217 and a plurality of protruded portions 1206 with cavities or vias 1219 in between the protruded portions. The cavities may have tapered or straight profiles, depending on the sidewall profiles of the protrusions of the mold chase as discussed above. The size of the cavities may be varied, for example, depending on a desired size of via contacts to be formed later The process continues to remove portions of the molded structure. In one embodiment, the base of the molded structure is removed, leaving the protruded portions as shown in FIG. 10*c*. The protruded portions of the molded structure after the thinning process may be referred to as the base substrate 106 of a package substrate. The base substrate, for example, is a patterned or predefined mold substrate having a plurality of cavities or vias 119 accommodating a plurality of via contacts. The base of the molded structure, in one embodiment, is removed by grinding. Other suitable techniques may also be used to thin the molded structure to a suitable thickness, depending on the desired thickness of a package substrate.

In another embodiment, a temporary carrier (not shown) may optionally be provided. For example, the molded structure may optionally be attached to the temporary carrier during thinning of the molded structure in cases where the molded structure is thin. In cases where the molded structure is sufficiently thick, the temporary carrier is not needed during the thinning process. The temporary carrier, for example, should be sufficiently rigid to serve as a support during the removal or thinning process. By way of a non-limiting example, the temporary carrier may be a metal carrier. Various suitable types of materials may be used to form the temporary carrier.

Figure 10D:
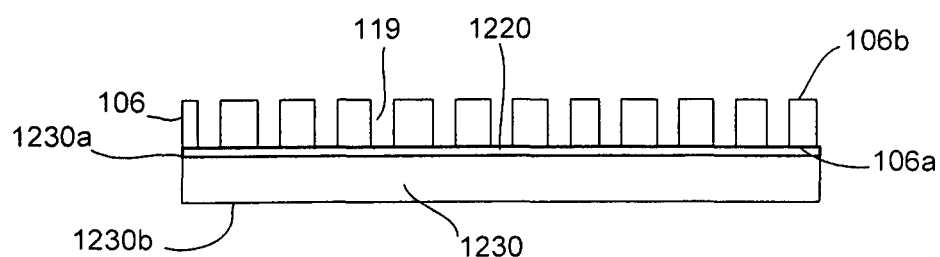

In one embodiment, a conductive carrier 1230 is provided as shown in FIG. 10*d*. The conductive carrier, for example, serves as a base for forming via contacts in the cavities 119 of the base substrate while forming part of the interconnect structures of the package substrate. In one embodiment, the conductive carrier includes a copper carrier. In another embodiment, the conductive carrier may include a multi-layered metal carrier, such as NiAu. Other suitable types of conductive carrier may also be useful.

In one embodiment, an adhesive layer 1220 is provided on a first surface 1230*a* of the conductive carrier 1230 to facilitate attachment of the base substrate 106 to the conductive carrier. The adhesive layer, for example, includes a UV sensitive laminate material or thermal sensitive laminate material. The adhesive layer can be any type of adhesive that provides bonding of the base substrate to the first surface of the conductive carrier. The adhesive layer may be in different forms. For example, the adhesive layer may be a tape, a liquid or a paste. The adhesive layer may be provided on the conductive carrier using various techniques. The technique employed may depend on the type or form of the adhesive. For example, a tape adhesive may be provided on the conductive carrier by lamination, a paste adhesive may be provided on the conductive carrier by printing while a liquid adhesive may be provided on the conductive carrier by spin-coating. Other suitable types of techniques may also be employed.

Referring to FIG. 10*d*, a first surface 106*a* of the base substrate, in one embodiment, is attached to the first surface 1230*a* of the conductive carrier with the use of the adhesive layer 1220 as described above. The base substrate is attached to the conductive carrier using any suitable techniques according to the equipment and the type of adhesive used.

In another embodiment, the conductive carrier 1230 prepared with the adhesive 1220 on its first surface 1230*a* as described above is provided immediately after forming the molded structure 1215 and prior to thinning the molded structure. In such situation, the molded structure is attached to the first surface of the conductive carrier with the use of the adhesive. Thinning process is performed to remove portions of the molded structure. As such, the conductive carrier may have sufficient thickness to also serve as a support carrier during thinning of the molded structure as well as serving as the base for forming via contacts in the cavities of the base substrate while forming part of the interconnect structures of the package substrate.

Figure 10E:
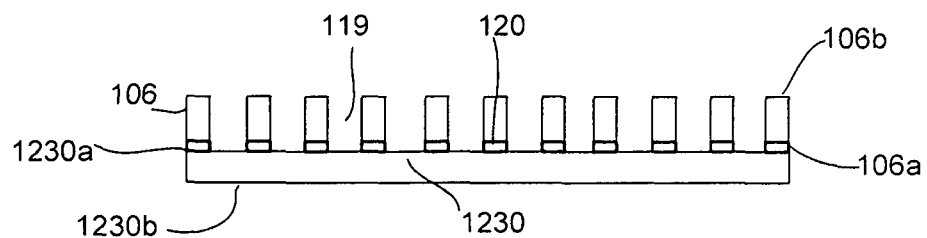

The process continues to remove exposed portions of the adhesive layer. In one embodiment, exposed portions of the adhesive layer may be removed by a patterning process. The patterning of the adhesive layer may be performed with the help of a patterned mask layer. Patterning of the adhesive layer can be achieved by any suitable etching techniques. For example, a patterned etch mask (not shown), such as a photoresist, is provided over the second surface 106*b* of the base substrate. Alternatively, the base substrate 106 may serve as an etch mask. An etch may be performed using the etch mask to remove portions of the adhesive layer unprotected by the etch mask. As shown in FIG. 10*e*, portions of the adhesive layer in the cavities 119 between the protruded portions of the base substrate are removed. As such, portions of the first surface of the conductive carrier in the cavities between the protruded portions are exposed. The etch, for example, may be wet etch or dry etch. Other suitable techniques may also be employed to remove portions of the adhesive layer. The adhesive 120 which contacts the first surface 106*a* of the base substrate remains.

After patterning the adhesive layer, the mask is removed. The mask, for example, may be removed by ashing. Other techniques for removing the mask may also be useful.

Figure 10F:
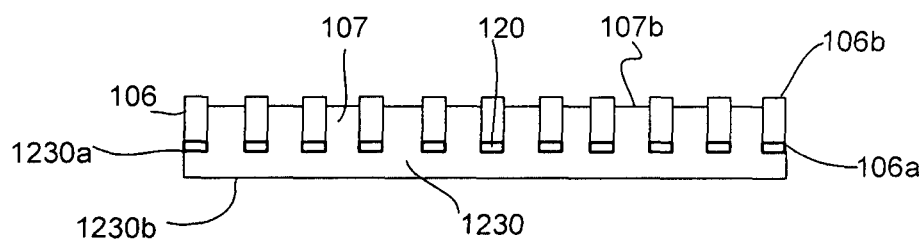

Referring to FIG. 10*f*, the process continues to form via contacts 107 of the package substrate. As shown, the via contacts are formed in the cavities or vias 119 between the protruded portions. In one embodiment, the via contacts may be copper or copper alloy. The via contacts, in one embodiment, are formed by plating. For example, electrochemical or electroless plating may be employed to form the via contacts. The conductive carrier thus serves as the base or substrate for the electroplating process. The via contacts, in one embodiment, may be formed by a single plated layer. In other embodiments, the via contacts may be formed by multiple plated layers, forming a multi-layered stack via contacts. The multi-layered stack, for example, may include copper, nickel, gold, silver, alloys, or a combination thereof. Other suitable methods for forming the via contacts and suitable types of conductive materials, including plating materials, may also be useful. In some embodiments, seed layers may be used prior to forming the conductive via contacts.

The second surface 107b of the via contacts, in one embodiment, are substantially coplanar with the second surface 106b of the base substrate. In another embodiment, the second surface 107b of the via contacts are non-coplanar with the second surface of the base substrate as shown in FIG. 10f. For example, the second surface of the via contacts may be above or below the second surface of the base substrate. Providing the second surface of the via contacts below the second surface of the base substrate may be advantageous as such configuration provides recesses or pockets for better receiving of package contacts at a later processing stage.

Figure 10G:
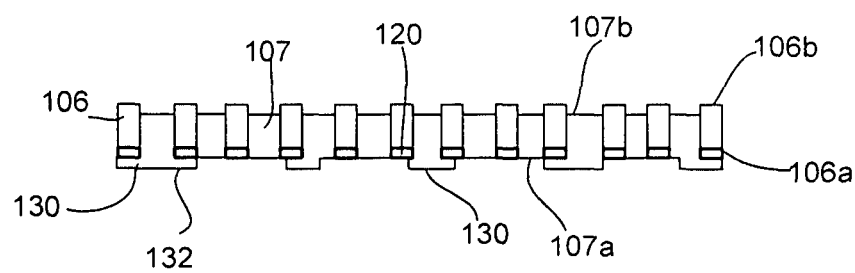

The process continues to form conductive traces 130 and connection pads 132 of the package substrate as shown in FIG. 10g. In one embodiment, the conductive traces 130 and connection pads 132 of the package substrate are formed by patterning the conductive carrier 1230. Patterning of the conductive carrier may be performed with the help of a patterned masked layer. Patterning of the conductive carrier can be achieved by any suitable etching techniques. For example, a patterned etch mask (not shown), such as photoresist, is provided over the second surface 1230b of the conductive carrier. An etch may be performed using the etch mask to remove portions of the conductive carrier unprotected by the etch mask. The etch, for example, may be an isotropic etch, such as a wet etch. An anisotropic etch, such as reactive ion etch (RIE) may be used. Other techniques for patterning the conductive carrier may also be useful. The thickness of the conductive traces 130 or connection pads 132, for example, is about 10 µm. The conductive traces and connection pads, as shown, are coupled to the via contacts 107 to form interconnect structures of the package substrate.

After patterning the conductive carrier, the mask is removed. The mask, for example, may be removed by ashing. Other techniques for removing the mask may also be useful.

Figure 10H:
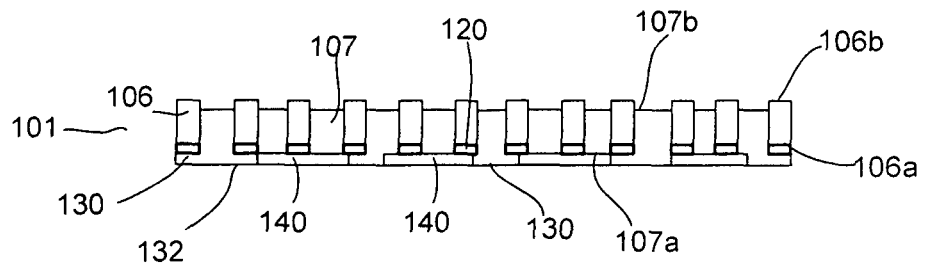

An insulating layer 140 may optionally be provided, covering and filling the spaces between the conductive traces 130 and connection pads 132 as shown in FIG. 10h. The insulating layer isolates the conductive traces and connection pads. In one embodiment, the insulating layer includes a dielectric material such as solder mask or inorganic insulating film. The insulating layer, for example, may be formed by molding or lamination technique. Other types of dielectric materials and techniques may also be useful for forming the insulating layer.

The package substrate 101 as formed includes a base substrate 106 having interconnect structures. The package substrate, as shown, includes interconnect structures having via contacts 107 and conductive traces 130 in a die region 105a and a non-die region 105b of the package substrate.

Figure 10I:
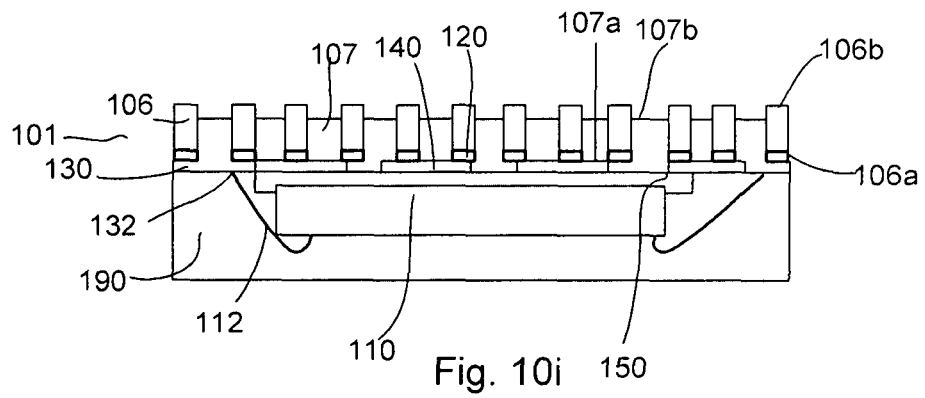

Referring to FIG. 10i, a die or a semiconductor chip 110 which includes circuit components is attached to the die region of the package substrate. The circuit components include, for example, transistors, resistors, capacitors and interconnections to form an IC. A final passivation layer (not shown) may be formed over the die. The final passivation layer includes openings (not shown) to expose die pads/contacts (not shown). The surface of the die which includes the openings to the die pads may be referred to as the active surface 110b of the die. In one embodiment, an adhesive layer 150 may be used to mount the die to the die region of the package substrate. For example, the inactive surface 110a of the die is mounted to the package substrate with the use of the adhesive layer. The adhesive layer, for example, may include an adhesive paste or die attach film, such as tape. Other types of adhesive, such as epoxy, may also be useful. In one embodiment, wire bonds 112 are formed to create electrical connection between the conductive traces on the package substrate and die pads on the die.

Referring to FIG. 10i, a cap 190 is formed on the package substrate. For example, an encapsulation material is dispensed to encapsulate the die and the wire bonds. In one embodiment, the encapsulation material includes a mold compound, such as molding epoxy resin material. Providing other types of encapsulation materials may also be useful. The cap includes first and second major surfaces 190a-b. In one embodiment, the second surface 190b of the cap contacts the adhesive 120 over the base substrate 106 and/or the conductive traces 130. As shown, the second surface 190b of the cap is separated from the base substrate by the adhesive and/or the conductive traces.

The cap, in one embodiment, is formed by transfer molding techniques. Encapsulation material, such as a mold compound, is dispensed into the mold assembly to form the cap. After molding, the molded die is separated from the mold. Other suitable types of techniques for forming the cap may also be useful. For example, the cap may also be formed by printing or compression molding.

Figure 10J:
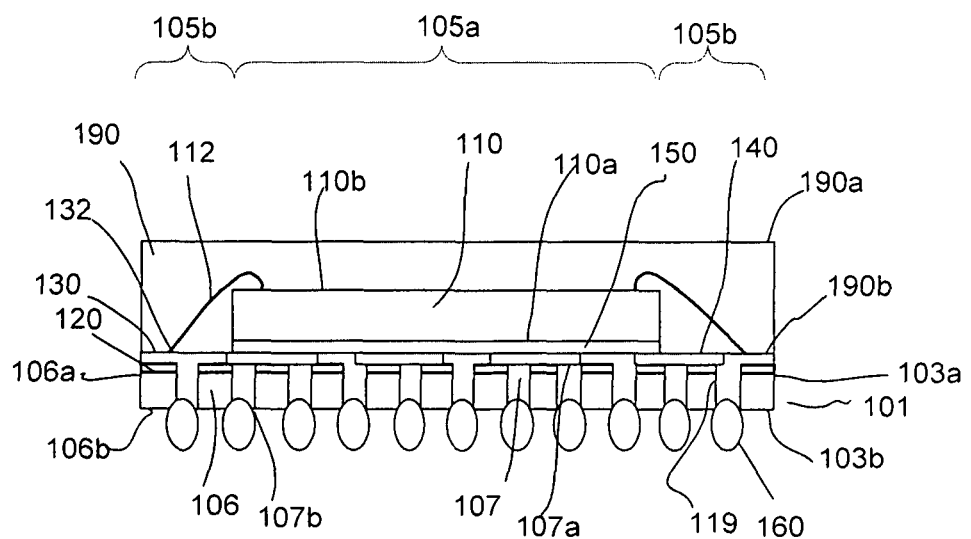

The process continues by forming package contacts 160 coupled to the via contacts 107, as shown in FIG. 10j. For example, the package contacts are formed on the second surface 107b of the via contacts. The package contacts, for example, may include spherical shaped structures or balls arranged in grid pattern to form a BGA type package. As such, a semiconductor package such as that shown in FIG. 1 is formed. The package contacts are formed of a conductive material. The package contacts, for example, can be formed from solder. Various types of solder can be used to form the package contacts. For example, the solder can be a lead-based or non lead-based solder.

In some embodiments, other types of package contacts are coupled to the via contacts. For example, the package contacts may include contacts which do not protrude from the bottom surface of the package substrate. Providing package contacts which do not protrude from the bottom surface of the package substrate, such as solder lands, may also be useful. The package contacts may be formed of materials other than solder or using other techniques.

The process as described with respect to FIGS. 10a-j is suitable for wire bonded type of die or chip packages. The process may also be useful for other types of dies, including flip chip applications. FIGS. 11a-d show another embodiment of a process for forming a semiconductor package. The process is similar to that described in FIGS. 10a-j. As such, common elements may not be described or described in detail.

Figure 11A:
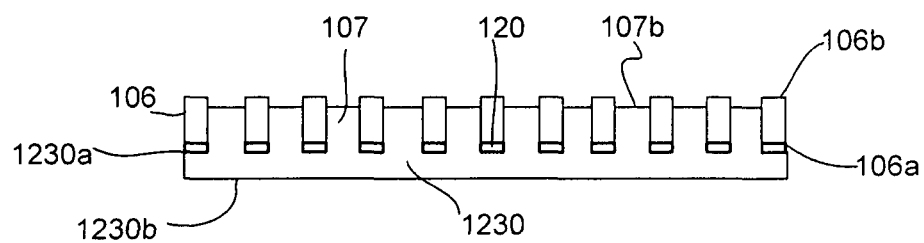

Referring to FIG. 11a, a partially processed package substrate is provided. The partially processed package substrate is at the stage of processing as described in FIG. 10f. For example, via contacts 107 of the package substrate are formed. The via contacts are formed in the cavities or vias between the protruded portions. The via contacts, in one embodiment, are formed by process and materials similar to that described in FIG. 10f. For example, the via contacts may include single or multiple plated layers. The via contacts as formed is similar to that as described in FIG. 10f. As such, the features of the via contacts will not be described or described in detail.

Figure 11B:
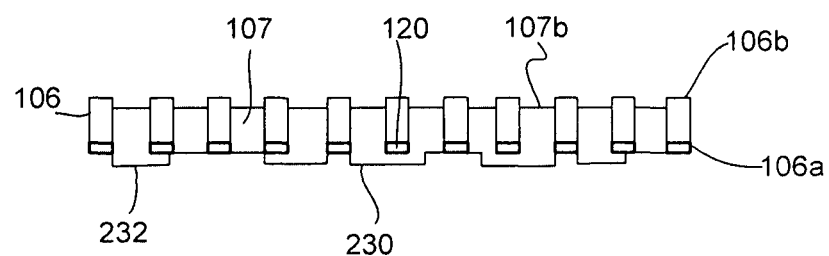

The process continues to form conductive traces 230 and connection pads 232 of the package substrate as shown in FIG. 11b. In one embodiment, the conductive traces 230 and connection pads 232 of the package substrate are formed by patterning the conductive carrier 1230. Patterning of the conductive carrier may be performed with the help of a patterned masked layer. Patterning of the conductive carrier can be achieved by any suitable etching techniques. For example, a patterned etch mask (not shown), such as photoresist, is provided over the conductive carrier. An etch may be performed using the etch mask to remove portions of the conductive carrier unprotected by the etch mask. The etch, for example, may be an isotropic etch, such as a wet etch. An anisotropic etch, such as reactive ion etch (RIE) may be used. Other techniques for patterning the conductive carrier may also be useful. The thickness of the conductive traces 230 or connection pads 232, for example, is about 10 μm. The conductive traces and connection pads, as shown, are coupled to via contacts to form interconnect structures of the package substrate. The conductive carrier is patterned to form conductive traces and connection pads coupled to the via contacts in the package substrate and are coupled to the die contacts of a flip chip later.

After patterning the conductive carrier, the mask is removed. The mask, for example, may be removed by ashing. Other techniques for removing the mask may also be useful.

The package substrate as formed includes a base substrate 106 having interconnect structures. The package substrate, as shown, includes interconnect structures having via contacts 107 and conductive traces 230 in a die region and a non-die region of the package substrate.

Figure 11C:
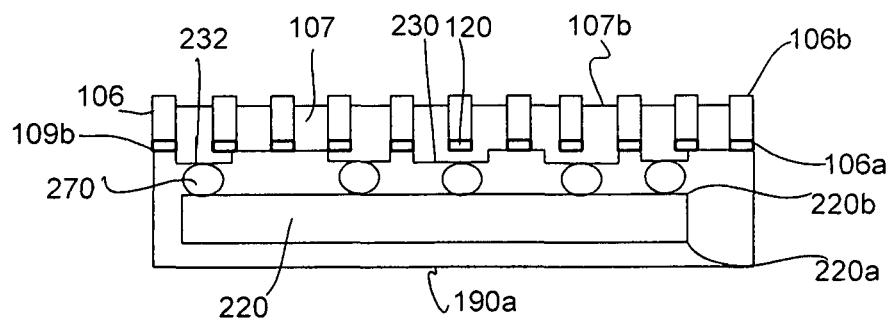

Referring to FIG. 11c, a flip chip 220 having die contacts 270 on an active surface 220b of the die is mounted onto the die region 105a. The connection pads 232, in the case of a flip chip application, are disposed in the die region of the package substrate. The connection pads 232, as shown, are configured to match the pattern of the die contacts 270 of the flip chip. An underfill (not shown), such as an epoxy-based polymeric material, may be provided in the space between the flip chip and the package substrate. Alternatively, no underfill is provided between the flip chip and the package substrate.

A cap 190 is formed on the package substrate. For example, an encapsulation material is dispensed to encapsulate the flip chip. For example, an encapsulation material is dispensed to fill the spaces between the die contacts and cover the inactive surface of the flip chip. In one embodiment, the encapsulation is a mold compound, such as molding epoxy resin material. Providing other types of encapsulation materials may also be useful.

Figure 11D:
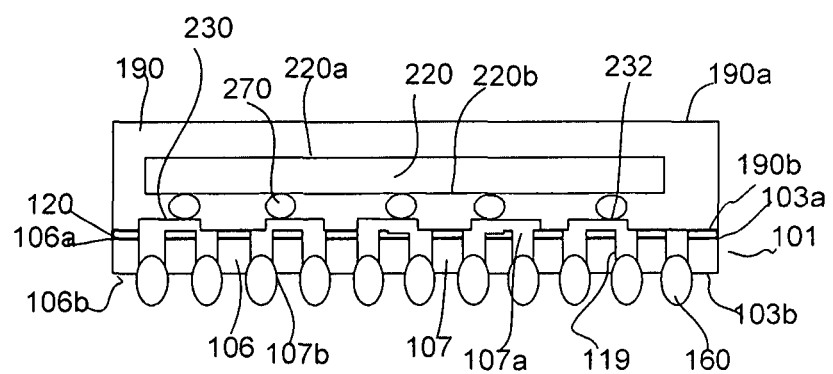

The cap, in one embodiment, is formed by transfer molding techniques. Encapsulation material, such as a mold compound, is dispensed into the mold assembly, surrounding the sides and covering the inactive surface of the flip chip to form the cap as shown in FIG. 11d. After molding, the molded die is separated from the mold. Other suitable types of techniques for forming the cap may also be useful. For example, the cap may also be formed by printing or compression molding.

In another embodiment, the cap is formed by a film assisted transfer molding technique. For example, a film is placed against contours of a mold (not shown). In one embodiment, when the package substrate and the die are placed against the mold, the film contacts the inactive surface of the flip chip. The cap surrounds the sides of the flip chip, leaving the inactive surface of the flip chip exposed to form a semiconductor package similar to that shown in FIG. 3. As such, the first surface of the cap is substantially coplanar with the inactive surface of the flip chip. By providing a cap which does not cover the inactive surface of the die helps improves the heat dissipation from the die. External heat sink may also be attached to the inactive surface of the die to further improve heat dissipation.

The process continues by forming package contacts 160 coupled to the conductive via contacts, as shown in FIG. 11d. For example, the package contacts are formed on the second surface 107b of the via contacts of the package substrate, similar to that described in FIG. 10j. As such, common features will not be described or described in detail. A semiconductor package such as that shown in FIG. 2 or 3 is formed.

The processes, as described with respect to FIGS. 10a-j and FIGS. 11a-d, result in advantages. For example, the via contacts, in one embodiment, are formed by plating. The use of plating technique provides flexibility in terms of controlling the height of the via contacts with respect to the surface of the base substrate. For example, the plating technique enables second surface of the via contacts to be substantially coplanar or non-coplanar, including protruding or recessed, with respect to the second surface of the base substrate. Providing the second surface of the via contacts which is disposed below or recessed with respect to the second surface of the base substrate is further advantageous as it provides recesses or pockets for better receiving of package contacts. Furthermore, the conductive traces, for example, are formed by an etch process. Etch process, for example, presents a relatively low cost solution for forming conductive traces relative to other techniques.

Moreover, as presented, the package substrate includes a plurality of via contacts held together and surrounded by the base substrate. As such, the via contacts will not be detached easily. This allows for improved robustness and reliability, such as enhanced lead pull strength, die pad drop, etc., relative to other types of packages, such as thermal leadless array (TLA). The package substrate as formed includes via contacts in the die and non-die regions. As such, the process enables formation of package substrate which serves as fan-in and fan-out redistribution structure for the die, enabling redistributed, fan-in and fan out external package connections. The semiconductor package, as described in an alternative embodiment of FIG. 11d, may have improved thermal performance as the inactive surface of the flip is exposed for dissipating heat. Moreover, such configuration also allows for inclusion of additional heat sink or heat spreader to further enhance heat dissipation.

Figure 12A:
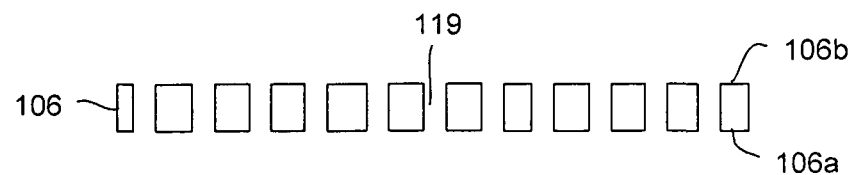

FIGS. 12a-f show another embodiment of a process for forming a semiconductor package. The process is similar to that described in FIGS. 10a-j and FIGS. 11a-d. Referring to FIG. 12a, a partially processed package substrate is provided. The partially processed package substrate is at the stage of processing as described in FIG. 10c. For example, portions of the molded structure are removed based on the techniques as already described or other suitable techniques, leaving the protruded portions. The protruded portions of the molded structure after the thinning process may be referred to as the base substrate 106 of a package substrate as described in FIG. 10c. The base substrate includes a plurality of cavities 119 as shown in FIG. 12a. As such, common elements may not be described or described in detail.

Figure 12B:
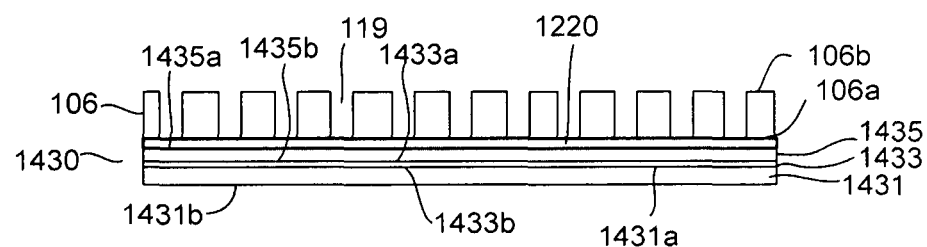

Referring to FIG. 12b, a conductive carrier or leadframe 1430 is provided. The conductive carrier, for example, may serve as part of the interconnect structures of the package substrate. The conductive carrier, in one embodiment, includes a multi-layered stack. In one embodiment, the conductive carrier includes first, second and third conductive layers. Providing other number of layers of conductive layer to form the multi-layered stack may also be useful.

In one embodiment, the first conductive layer 1431 includes a copper layer. The first conductive layer includes first and second major surfaces 1431a-b. The first conductive layer, for example, is sufficiently thick to support the structure. The second conductive layer 1433 having first and second major surfaces 1433a-b is provided over the first major surface 1431a of the first conductive layer 1431. The second conductive layer 1433, in one embodiment, includes a nickel layer. The third conductive layer 1435 having first and second major surfaces 1435a-b is formed over the first major surface 1433a of the second conductive layer. In one embodiment, the third conductive layer includes the same material as the first conductive layer. For example, the third conductive layer includes copper. Providing the third conductive layer with different material than the first conductive layer may also be useful. The second conductive layer, in one embodiment, includes different material than the third conductive layer. Any other suitable types of materials may be used for the second conductive layer so long as it provides etch selectivity between the second and third conductive layers. Other suitable types of materials may also be used for the first, second and third conductive layers.

In one embodiment, the second and third conductive layers are formed by plating. For example, electrochemical or electroless plating may be employed to form the second and third conductive layers. The first conductive layer of the conductive carrier thus also serves as a base or substrate for the electroplating process for forming the second conductive layer while the second conductive layer serves as a base or substrate for the electroplating process for forming the third conductive layer. Other suitable types of techniques may also be employed for forming the second and third conductive layers. The second conductive layer, for example, is sufficiently thin if it is of high electrical resistance, such as nickel. Other suitable thicknesses may also be useful. The thickness of the third conductive layer, for example, may be varied to a desired thickness of conductive traces and connection pads to be formed later.

In one embodiment, an adhesive layer 1220 is provided on a first surface 1430a of the conductive carrier to facilitate attachment of the base substrate 106 to the conductive carrier. For example, an adhesive layer is provided over the second surface 1435a of the third conductive layer 1435. The adhesive layer, for example, includes a UV sensitive laminate material or thermal sensitive laminate material. Any other suitable types of adhesive material may also be used. The adhesive layer can be any type of adhesive that provides bonding of the base substrate to the first surface of the conductive carrier. The adhesive layer may be in different forms. For example, the adhesive layer may be a tape, a liquid or a paste. The adhesive layer may be provided on the conductive carrier using various techniques. The technique employed may depend on the type or form of the adhesive. For example, a tape adhesive may be provided on the conductive carrier by lamination, a paste adhesive may be provided on the conductive carrier by printing while a liquid adhesive may be provided on the conductive carrier by spin-coating. Other suitable types of techniques may also be employed.

Referring to FIG. 12b, a first surface 106a of the base substrate, in one embodiment, is attached to the first surface 1430a of the conductive carrier with the use of the adhesive layer 1220 as described above. The base substrate is attached to the conductive carrier using any suitable techniques according to the equipment and the type of adhesive used.

Figure 12C:
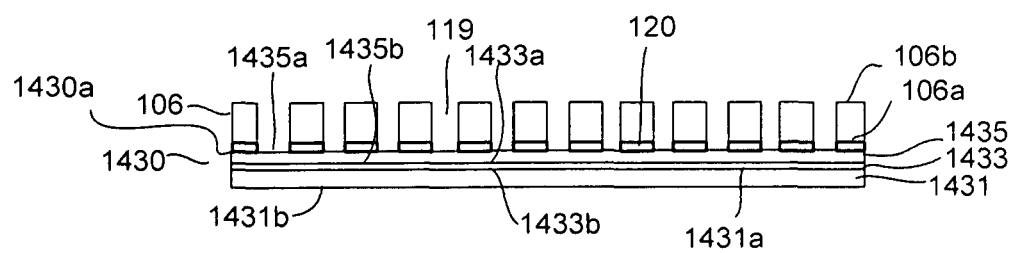

The process continues to remove exposed portions of the adhesive layer 1220 as shown in FIG. 12c. In one embodiment, portions of the adhesive layer may be removed by a patterning process. The patterning of the adhesive layer may be performed with the help of a patterned mask layer. Patterning of the adhesive layer can be achieved by any suitable etching techniques. For example, a patterned etch mask (not shown), such as a photoresist, is provided over the second surface 106b of the base substrate. Alternatively, the base substrate 106 may be used as an etch mask. An etch may be performed using the etch mask to remove portions of the adhesive layer unprotected by the etch mask. As shown in FIG. 12c, portions of the adhesive layer in the cavities 119 between the protruded portions of the base substrate are removed. As such, portions of the first surface 1435a of the third conductive layer 1435 in the cavities between the protruded portions are exposed. The etch, for example, may be wet etch or dry etch. Other suitable techniques may also be employed to remove portions of the adhesive layer. The adhesive 120 which contacts the first surface 106a of the base substrate remains.

After patterning the adhesive layer, the mask is removed. The mask, for example, may be removed by ashing. Other techniques for removing the mask may also be useful.

Referring to FIG. 12d, the process continues to form via contacts 107 of the package substrate. As shown, the via contacts are formed in the cavities or vias 119 between the protruded portions. The via contacts, in one embodiment, are formed by process and materials similar to that described in FIG. 10f. For example, the via contacts may include single or multiple plated layers. As such, the via contacts as formed are similar to that as described in FIG. 10f. As such, feature of the via contacts will not be described or described in detail.

The process continues by removing the first and second conductive layers 1431 and 1433 of the conductive carrier as shown in FIG. 12e. In one embodiment, the first and second conductive layers of the conductive carrier are removed by an etch process. The etch process, in one embodiment, includes a two-step etch process. The first etch, for example, removes the first conductive layer 1431. Thus, the second conductive layer serves as an etch stop or barrier layer during the removal of the first conductive layer. The second etch, for example, removes the second conductive layer 1433. Since the second and third conductive layers include different materials, the second etch stops on the second surface 1435b of the third conductive layer. As such, the third conductive layer will not be overetched during the removal of the second conductive layer. The etch process, such as chemistry and other parameters, may be tailored to selectively remove the desired material with respect to the other material. Other suitable types of techniques may also be employed to remove the first and second conductive layers.

In one embodiment, the process continues to form conductive traces 130 and connection pads 132 of the package substrate as shown in FIG. 12f<sub>i</sub>. In one embodiment, the conductive traces and connection pads of the package substrate are formed by patterning the remaining third conductive layer 1435. Patterning of the third conductive layer may be performed with the help of a patterned masked layer. Patterning of the third conductive layer can be achieved by any suitable etching techniques. For example, a patterned etch mask (not shown), such as photoresist, is provided over the second surface 1435b of the third conductive layer. An etch may be performed using the etch mask to remove portions of the third conductive layer unprotected by the etch mask. The etch, for example, may be an isotropic etch, such as a wet etch. An anisotropic etch, such as reactive ion etch (RIE) may be used. Other techniques for patterning the third conductive, layer may also be useful. As shown in FIG. 12$f_i$, the thickness of the third conductive layer defines the thickness of the conductive traces and connection pads formed. The conductive traces and connection pads, as shown, are coupled to the via contacts 160 to form interconnect structures of the package substrate.

After patterning the third conductive layer, the mask is removed. The mask, for example, may be removed by ashing. Other techniques for removing the mask may also be useful.

An insulating layer may optionally be provided, covering and filling the spaces between conductive traces and connection pads, similar to that described in FIG. 10h. A die which includes circuit components similarly described in FIG. 10i is attached to the die region of the package substrate. The process continues, as similarly described in FIG. 10i and onwards. As such, these process steps will not be described or described in detail. The process continues until a package similar to that shown in FIG. 1 is formed.

In another embodiment, conductive traces 230 and connection pads 232 of the package substrate are formed after removing the first and second conductive layers 1431 and 1433 of the conductive carrier 1430 as shown in FIG. 12$f_{ii}$. The conductive traces and connection pads of the package substrate, for example, are formed by patterning the third conductive layer 1435. Patterning of the third conductive layer is similar to that described with respect to FIG. 11b. As shown in FIG. 12$f_{ii}$, the thickness of the third conductive layer defines the thickness of the conductive traces and connection pads formed. The connection pads formed in the die region of the package substrate, as shown, are coupled to via contacts to form interconnect structures of the package substrate. The third conductive layer is patterned to form conductive traces and connection pads coupled to the via contacts and are coupled to the die contacts of a flip chip later.

After forming the conductive traces and connection pads, a flip chip 220 having die contacts on an active surface of the die is mounted onto the die region, similar to that described with respect to FIG. 11c. The process continues, as similarly described in FIG. 11c and onwards. As such, these process steps will not be described or described in detail. The process continues until a package similar to that shown in FIG. 2 or FIG. 3 is formed.

The embodiment described with respect to FIGS. 12a-f includes some or all advantages as described with respect to FIG. 10a-j and FIGS. 11a-d. As such, these advantages will not be described or described in detail. The embodiment, as described with respect to FIGS. 12a-f results in additional advantages. The base substrate, as described are formed from using molding techniques. The thickness of the base substrate, for example, may be defined by the height of the protrusions on the mold chase. Thus, such method provides flexibility and allows base substrate or package substrate of various thicknesses to be formed.

In addition, the second and third conductive layers, such as nickel and copper layer, in one embodiment, are plated onto the first conductive layer to form the conductive carrier for better handling. For example, the second conductive layer, such as nickel, acts as a barrier during the removal of the first conductive layer. As such, the third conductive layer and the via contacts will not be overetched during the removal of the first conductive layer.

As described, the third conductive layer of the conductive carrier in FIGS. 12a-f which is used for forming the conductive traces is formed by plating. This allows better control of the thickness of the conductive traces. For example, conductive traces with finer or thinner profile can be formed. The conductive traces having thinner profile requires a shorter etching time, resulting in easier process control and reduces the risk of over-etching into the via contacts. Moreover, the plating technique does not require tight control of the flatness of the carrier.

FIGS. 13a-f show another embodiment of a process for forming a semiconductor package. The process is similar to that described in FIGS. 10a-j, FIGS. 11a-d and FIGS. 12a-f. As such, common elements may not be described or described in detail.

Figure 13A:
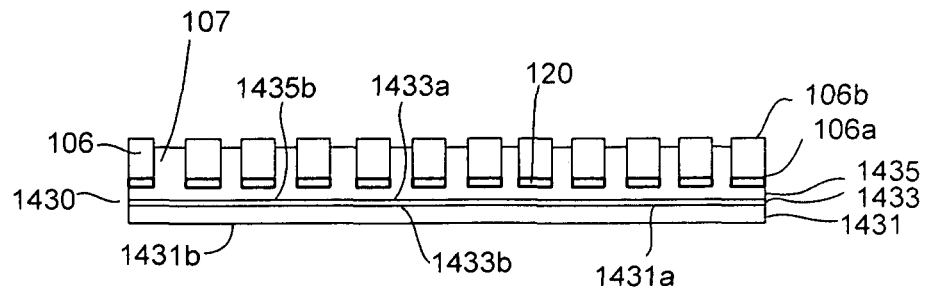

Referring to FIG. 13a, a partially processed package substrate is provided. The partially processed package substrate is at the stage of processing as described in FIG. 12d. For example, conductive carrier 1430 is provided and via contacts 107 are formed in the cavities or vias 119 between the protruded portions. The conductive carrier is formed by process and materials as described in FIG. 12b while conductive via contacts, in one embodiment, are formed by process and materials similar to that described in FIG. 10f. As such, feature of the conductive carrier 1430 and via contacts 107 will not be described or described in detail.

Figure 13B:
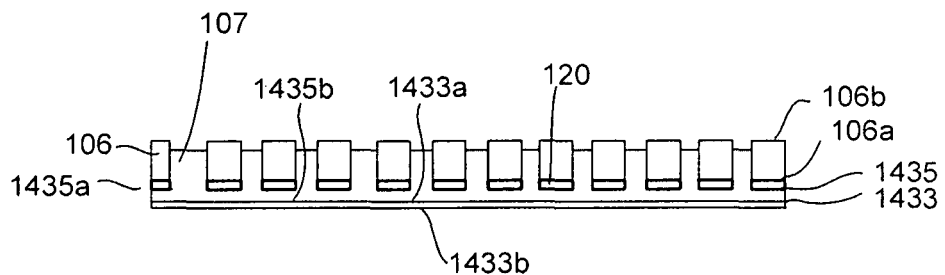

Referring to FIG. 13b, the process continues by removing the first conductive layer 1431 of the conductive carrier 1430. In one embodiment, an etch process may be performed to remove the first conductive layer. Other techniques for removing the first conductive layer may also be useful. The etch, for example, removes the first conductive layer and stops at the second surface 1433b of the second conductive layer. As such, the second conductive layer serves as an etch stop layer.

Figure 13C:
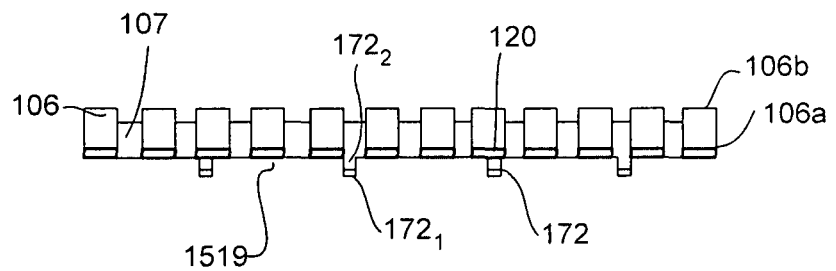

In one embodiment, the process continues to form further interconnect level of the package substrate. The process continues to form conductive studs 172 over and couple to the via contacts as shown in FIG. 13c. In one embodiment, portions of the second and third conductive layers 1433 and 1435 are removed to form the conductive studs 172. In one embodiment, the second and third conductive layers of the conductive carrier 1430 are patterned to create a pattern which defines the conductive studs 172 with spaces 1519 in between the conductive studs as shown in FIG. 13c. The conductive studs, for example, may be formed over the center of the via contacts. Forming the conductive studs over regions other than the center of the via contacts may also be useful. Patterning of the second and third conductive layers of the conductive carrier may be performed with the help of a patterned masked layer. Patterning of the second and third conductive layers can be achieved by any suitable etching techniques. For example, a patterned etch mask (not shown), such as photoresist, is provided over the first conductive layer 1431. A two-step etch process may be performed using the etch mask to remove portions of the second and third conductive layers unprotected by the etch mask. The first etch, for example, removes portions of the second conductive layer 1433 unprotected by the mask. Thus, the third conductive layer 1435 serves as an etch stop layer during the removal of the portions of the second conductive layer. The second etch, for example, removes portions of the third conductive layer 1435 unprotected by the mask. The second etch, for example, stops at the adhesive 120 on the base substrate. Other techniques for patterning the second and third conductive layers may also be useful.

The conductive studs as formed, in one embodiment, include a multi layered stack as shown in FIG. 13c. The width and thickness of the conductive studs as formed, for example, may be less than or equal to the width and thickness of the via contacts. Other suitable widths may also be useful. The thickness of the conductive studs, as shown, corresponds to the thickness of the second and third conductive layers of the conductive carrier.

Figure 13D:
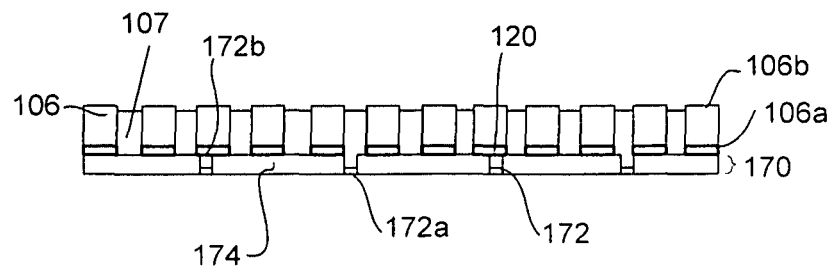

An insulating layer 174 is provided, covering and filling the spaces between the conductive studs 172 as shown in FIG. 13d. The insulating layer provides insulation between the conductive studs. In one embodiment, the insulating layer includes a dielectric material such as solder mask or inorganic insulating film. The insulating layer, for example, may be formed by molding or lamination technique. Other types of dielectric materials and techniques for forming the insulation layer may also be useful. As shown in FIG. 13d, the insulation layer is formed around the conductive stud, exposing the first surface 172a of the conductive studs. The thickness of the insulating layer, for example, may be substantially the same as or lesser than the thickness of the conductive studs.

Referring to FIG. 13e, the process continues to form conductive traces 130 and connection pads 132. In one embodiment, the conductive traces and connection pads are formed of a material different than that of the conductive studs. Other types of conductive materials, such as the same as the conductive studs, may also be useful. The conductive traces and connection pads, in one embodiment, are formed by plating. For example, electrochemical or electroless plating may be employed to form the conductive traces and connection pads. The first conductive layer of the conductive studs thus also serves as a base or substrate for the electroplating process. Other suitable methods for forming the conductive traces and connection pads may also be used. The thickness of the conductive traces or connection pads, for example, may be as low as about 10µ. As shown, the conductive traces are formed over the insulating layer 174 and top surfaces of the conductive studs in the die and non-die regions of the package substrate and are electrically coupled to the conductive studs 172. The conductive traces 130 may be extended from the side surfaces of the conductive studs 172. In cases where the conductive studs 172 include a multi-layered stack, the conductive traces 130 may extend from the two or more layers of the multi-layered stack of the conductive studs 172.

A die 110 which includes circuit components similarly described in FIG. 10i is attached by an adhesive layer 150 to the die region of the package substrate. The process continues, as similarly described in FIG. 10i and onwards. As such, these process steps will not be described or described in detail. The process continues until a package as shown in FIG. 13l similar to that shown in FIG. 4 is formed.

In another embodiment, conductive traces 230 and connection pads 232 of the package substrate are formed after forming the insulating layer 174 as described in FIG. 13d. In one embodiment, the conductive traces and connection pads are formed of a material different than that of the conductive studs. Other types of conductive materials, such as the same as the conductive studs, may also be useful. The conductive traces and connection pads, in one embodiment, are formed by plating. For example, electrochemical or electroless plating may be employed to form the conductive traces and connection pads. The first conductive layer of the conductive studs thus also serves as a base or substrate for the electroplating process. Other suitable methods for forming the conductive traces and connection pads may also be used. The thickness of the conductive traces or connection pads, for example, may be as low as about 10 µm. As shown, the conductive traces and connection pads are formed over the insulating layer 174 in the die region of the package substrate and are electrically coupled to the conductive studs 172. The conductive traces and connection pads are coupled to the conductive studs and are coupled to die contacts 270 of a flip chip later.

After forming the conductive traces and connection pads, a flip chip 220 having die contacts 270 on an active surface of the die is mounted onto the die region, similar to that described with respect to FIG. 11c. The process continues, as similarly described in FIG. 11c and onwards. As such, these process steps will not be described or described in detail. The process continues until a package as shown in FIG. 13$f_{ii}$ similar to that shown in FIG. 6 is formed.

FIGS. 14a-e show another embodiment of a process for forming a semiconductor package. The process is similar to that described in FIGS. 10a-j, FIGS. 11a-d, FIGS. 12a-f and FIGS. 13a-f. As such, common elements may not be described or described in detail.

Figure 14A:
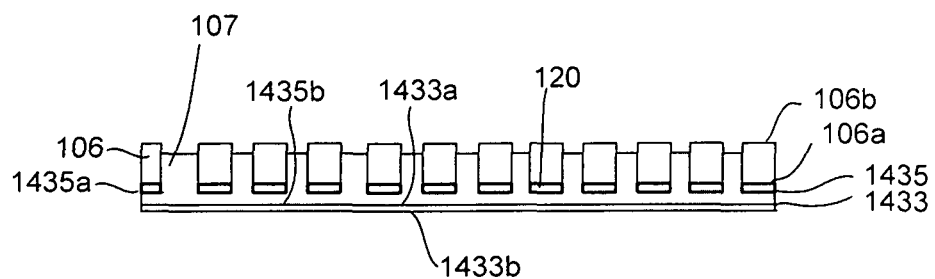

Referring to FIG. 14a, a partially processed package substrate is provided. The partially processed package substrate is at the stage of processing as described in FIG. 13b. For example, via contacts 107 are formed in the cavities or vias between the protruded portions and the first conductive layer 1431 of the conductive carrier 1430 is removed.

The process continues to remove the second conductive layer 1433. In one embodiment, an etch process may be performed to remove the second conductive layer. Since the second and third conductive layer include different materials, the etch for example, stops at the second surface 1435b of the third conductive layer, exposing the surface of the third conductive layer. Other techniques for removing the second conductive layer may also be useful.

Figure 14B:
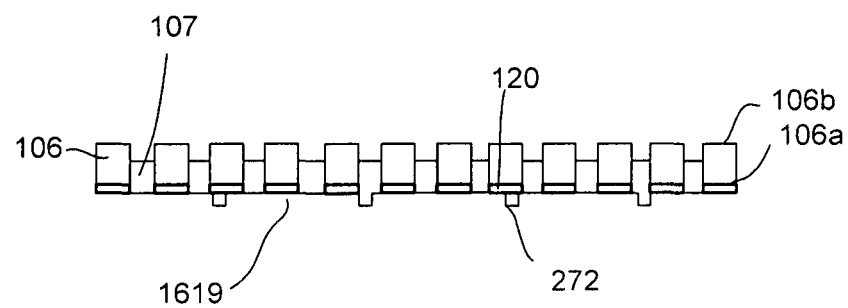

Referring to FIG. 14b, the process continues to form further interconnect level 170 of the package substrate. The process continues to form conductive studs 272 over the conductive via contacts. The process continues to form conductive studs 272 over the via contacts as shown in FIG. 14b. In one embodiment, portions of the third conductive layer 1435 are removed to form the conductive studs. In one embodiment, the third conductive layers of the conductive carrier are patterned to create a pattern which defines the conductive studs 272 with cavities or vias 1619 in between the conductive studs as shown in FIG. 14b. Patterning of the third conductive layer of the conductive carrier may be performed with the help of a patterned masked layer. Patterning of the third conductive layer can be achieved by any suitable etching techniques. For example, a patterned etch mask (not shown), such as photoresist, is provided over the third conductive layer. An etch process may be performed using the etch mask to remove portions of the third conductive layer unprotected by the etch mask. Other techniques for patterning the second and third conductive layers may also be useful. As shown in FIG. 14b, portions of the third conductive layer unprotected by the mask are removed.

The conductive studs 272, as formed, include a single conductive layer. The width and thickness of the conductive studs as formed, for example; may be lesser than or equal to the width and thickness of the via contacts. Other suitable widths may also be useful. The thickness of the conductive studs, as shown, corresponds to the thickness of the third conductive layer 1435.

Figure 14C:
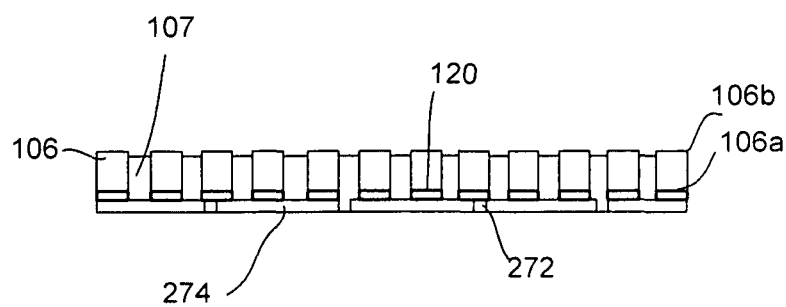

An insulating layer 274 is provided, covering and filling the spaces between the conductive studs 272 as shown in FIG. 14c. The insulating layer provides insulation between the conductive studs. In one embodiment, the insulating layer includes a dielectric material such as solder mask or inorganic insulating film. The insulating layer, for example, may be formed by molding or lamination technique. Other types of dielectric materials and techniques for forming the insulation layer may also be useful. As shown in FIG. 14c, the insulating layer is formed around the conductive stud, exposing the first surface 272a of the conductive studs. The thickness of the insulating layer 274, for example, may be substantially the same as or lesser than the thickness of the conductive studs 272.

The process continues to form conductive traces 130 and connection pads 132 over the insulating layer 274 and which are coupled to the conductive studs 272. In one embodiment, the conductive traces 130 and connection pads 132 are formed of the same material of the conductive studs 272, such as copper. Other types of conductive materials, such as different than the conductive studs, may also be useful. The conductive traces and connection pads, in one embodiment, are formed by plating. For example, electrochemical or electroless plating may be employed to form the conductive traces and connection pads. The conductive studs 272 thus also serve as a base or substrate for the electroplating process. Other suitable methods for forming the conductive traces may also be used. The thickness of the conductive traces or connection pads, for example, may be as low as about 10 μm. As shown, the conductive traces are formed over the insulating layer 274 and top surface of the conductive studs in the die and non-die regions of the package substrate and are electrically coupled to the conductive studs 272. The conductive traces 130 may be extended from the side surfaces of the conductive studs 272.

Referring to FIG. 14$e_i$, a die 110 which includes circuit components similarly described in FIG. 12$i$ is attached by an adhesive layer 150 to the die region of the package substrate. The process continues, as similarly described in FIG. 10$i$ and onwards. As such, these process steps will not be described or described in detail. The process continues until a package as shown in FIG. 14$e_i$ similar to that shown in FIG. 5 is formed.

In another embodiment, conductive traces 230 and connection pads 232 of the package substrate are formed after forming the insulating layer 274 as described in FIG. 14c. In one embodiment, the conductive traces and connection pads are formed of the same material of the conductive studs 272, such as copper. Other types of conductive materials, such as the different than the conductive studs, may also be useful. The conductive traces and connection pads, in one embodiment, are formed by plating. For example, electrochemical or electroless plating may be employed to form the conductive traces and connection pads. The conductive studs 272 thus also serve as a base or substrate for the electroplating process. Other suitable methods for forming the conductive traces and connection pads may also be used. The thickness of the conductive traces or connection pads, for example, may be as low as about 10 μm. As shown, the conductive traces are formed over the insulating layer 274 and top surface of the conductive studs 272 in, the die region of the package substrate and are electrically coupled to the conductive studs 272. The conductive traces and connection pads are coupled to the conductive studs 272 and are coupled to die contacts 270 of a flip chip later.

After forming the conductive traces and connection pads, a flip chip 220 having die contacts 270 on an active surface of the die is mounted onto the die region, similar to that described with respect to FIG. 11c. The process continues, as similarly described in FIG. 11c and onwards. As such, these process steps will not be described or described in detail. The process continues until a package similar to that shown in FIG. 7 is formed.

The embodiments described with respect to FIGS. 13a-f and FIGS. 14a-e include some or all advantages as described with respect to FIG. 10a-j, FIGS. 11a-d and FIGS. 12a-f. As such, these advantages will not be described or described in detail. The embodiments, as described with respect to FIGS. 13a-f and FIGS. 14a-e result in further advantages. The embodiments of FIGS. 13a-f and FIGS. 14a-e include formation of further interconnect level of the package substrate. The further interconnect level includes conductive studs. The width of the conductive studs, as described, is smaller than the width of the via contacts. The conductive studs as described need not be formed at the center of the via contacts and its smaller width relative to the via contacts provide allowance for more traces, leading to more flexible and efficient routability of traces.

Furthermore, conductive traces of the embodiments as described in FIGS. 13a-f and FIGS. 14a-e are formed by plating. Such technique allows fine pitch traces to be formed, resulting in thinner packages. The second conductive layer, in the embodiment described in FIGS. 14a-e, may be removed after removing the first conductive layer. This allows the conductive stud to be formed of a single material which is the same material as the via contacts. Resistance is lowered particularly where the interconnect structure of the package substrate, including the conductive traces, studs and via contacts, is formed of a single material. This further enhances the performance of the semiconductor packages. Moreover, the conductive studs as described in the embodiment of FIGS. 14a-e have thinner profile. This enables further thinner packages to be formed.

Figure 15A:
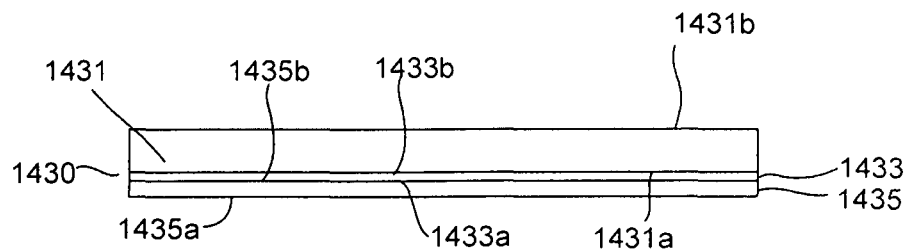
Figure 15B:
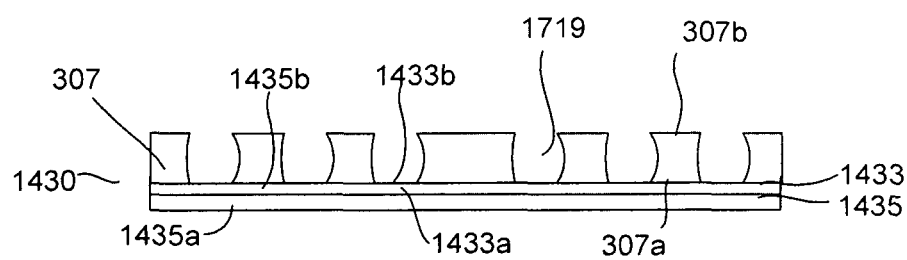

FIGS. 15a-h show another embodiment of a process for forming a semiconductor package. The process include similar process to that described in FIGS. 10a-j, FIGS. 11a-d, FIGS. 12a-f and FIGS. 13a-f and FIGS. 14a-e. As such, common processes may not be described or described in detail. Referring to FIG. 15a, a conductive carrier 1430 is provided. The conductive carrier 1430 is similar to that described in FIG. 12b. The materials, thickness and process for forming the conductive carrier are similar to that described in FIG. 12b. As such, common elements may not be described or described in detail. In one embodiment, the conductive carrier also serves as via contacts in the package substrate while forming part of the interconnect structures of the package substrate as will be described later.

The process continues to remove portions of the first conductive layer 1431. In one embodiment, the first conductive layer 1431 of the conductive carrier 1430 is patterned to create a pattern which defines the via contacts 307 of the package substrate with cavities or vias 1719 in between the via contacts. Patterning of the first conductive layer of the conductive carrier may be performed with the help of a patterned masked layer. Patterning of the first conductive layer can be achieved by any suitable etching techniques. For example, a patterned etch mask (not shown), such as photoresist, is provided over the conductive carrier. An etch may be performed using the etch mask to remove portions of the first conductive layer unprotected by the etch mask. The etch, for example, may be an isotropic etch, such as a wet etch. An anisotropic etch, such as reactive ion etch (RIE) may be used. Since the first and second conductive layers include different materials, the etch for example, stops at the second surface 1433b of the second conductive layer 1433, exposing the surface of the second conductive layer.

As such, the second conductive layer serves as an etch stop layer. Other techniques for patterning the first conductive layer may also be useful.

After patterning the first conductive layer, the mask is removed. The mask, for example, may be removed by ashing. Other techniques for removing the mask may also be useful.

The process continues by forming a substrate material over the conductive carrier. In one embodiment, a substrate material is dispensed over the conductive carrier and filling the cavities 1719 between the via contacts 307. In one embodiment, the substrate material is a mold compound, such as molding epoxy resin material. Providing other suitable types of substrate material may also be useful.

The substrate material, in one embodiment, is formed by transfer molding technique. Mold material, for example, is dispensed into the mold assembly, filling the cavities in between the via contacts. After molding, the molded structure is separated from the mold. Other suitable types of techniques for forming the substrate material may also be useful. For example, the substrate material may also be formed by printing, film assisted molding or compression molding.

Figure 15C:
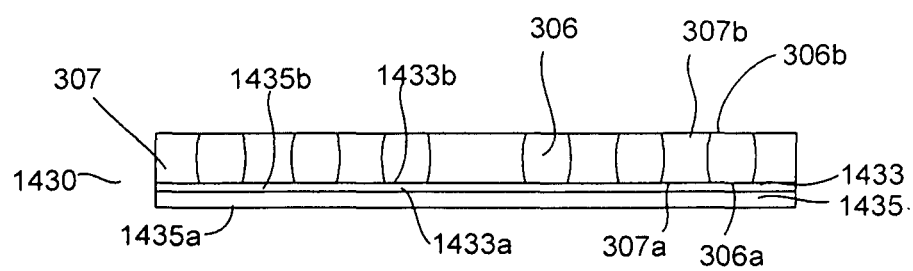

The process continues to remove portions of the molded structure. In one embodiment, excessive portions of the mold material over the first conducive layer are removed. In one embodiment, excessive portions of the mold material over the first conductive layer are removed by grinding. Other suitable techniques may also be used to remove excessive portions of the mold material. In one embodiment, grinding process is performed to remove the excess portions of the mold material and stops at the second surface 307b of the via contacts, leaving the mold material in between the via contacts as shown in FIG. 15c. The mold materials which remain in between the conductive via contacts after the grinding process may be referred to as the base substrate of the package substrate. The mold materials also serve as insulating layer providing electrical isolation between adjacent via contacts.

Figure 15D:
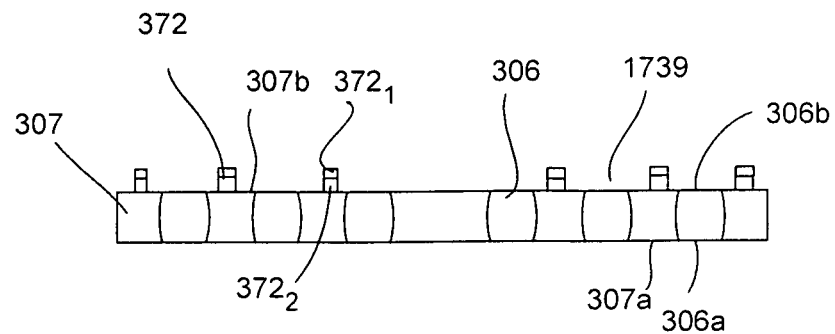

In one embodiment, the process continues to form further interconnect level of the package substrate. The process continues to form conductive studs 372 over the via contacts. In one embodiment, portions of the second and third conductive layers are removed to form the conductive studs 372. In one embodiment, the second and third conductive layers 1433 and 1435 of the conductive carrier are patterned to create a pattern which defines the conductive studs with spaces 1739 in between the conductive studs as shown in FIG. 15d. Patterning of the second and third conductive layers of the conductive carrier may be performed with the help of a patterned masked layer. Patterning of the second and third conductive layers can be achieved by any suitable etching techniques. For example, a patterned etch mask (not shown), such as photoresist, is provided over the third conductive layer. A two-step etch process may be performed using the etch mask to remove portions of the second and third conductive layers unprotected by the etch mask. The first etch, for example, removes portions of the third conductive layer 1435 unprotected by the mask. Thus, the second conductive layer 1433 serves as an etch stop layer during the removal of the portions of the third conductive layer 1435. The second etch, for example, removes portions of the second conductive layer 1433 unprotected by the mask. The second etch, for example, stops at the first surface 307a of the conductive via contacts. Other techniques for patterning the second and third conductive layers may also be useful.

The conductive studs 372 as formed, in one embodiment, include a multi layered stack $372_{1-2}$ as shown in FIG. 15d. The width and thickness of the conductive studs as formed, for example, may be less than or equal to the width and thickness of the via contacts. Other suitable widths may also be useful. The thickness of the conductive studs, as shown, corresponds to the thickness of the second and third conductive layers of the conductive carrier.

Figure 15E:
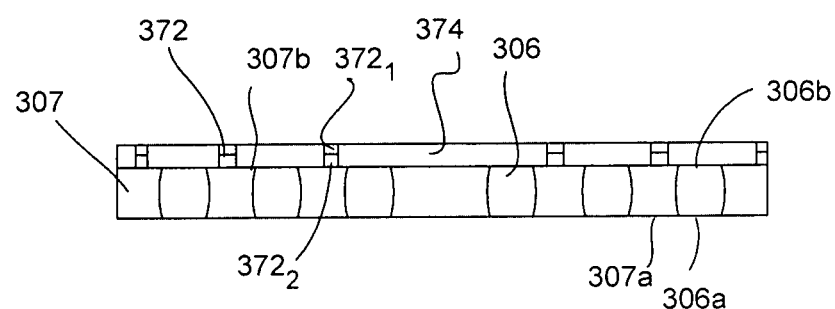

An insulating layer 374 is provided, covering and filling the spaces between the conductive studs 372 as shown in FIG. 15e. The insulating layer provides insulation between the conductive studs. In one embodiment, the insulating layer includes a dielectric material such as solder mask or inorganic insulating film. The insulating layer, for example, may be formed by molding or lamination technique. Other types of dielectric materials and techniques for forming the insulation layer may also be useful. As shown in FIG. 15e, the insulation layer is formed around the conductive studs, exposing the first surface 372a of the conductive studs. The thickness of the insulating layer 374, for example, may be substantially the same as or lesser than the thickness of the conductive studs 372.

Figure 15F:
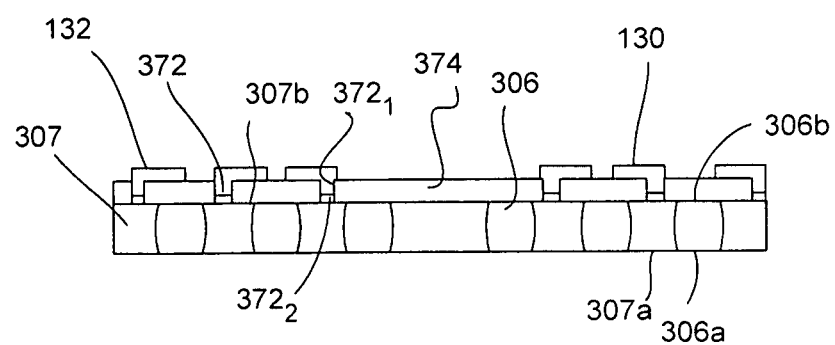

The process continues to form conductive traces 130 and connection pads 132 of the package substrate as shown in FIG. 15f. In one embodiment, the conductive traces 130 and connection pads 132 are formed of the same material as the conductive studs. Other types of conductive materials, such as different than the conductive studs, may also be useful. The conductive traces 130 and connection pads 132, in one embodiment, are formed by plating. For example, electrochemical or electroless plating may be employed to form the conductive traces and connection pads. The first conductive layer $372_1$ and/or the second conductive layer $372_2$ of the conductive studs 372 thus also serve as a base or substrate for the electroplating process. Other suitable methods for forming the conductive traces and connection pads may also be used. The thickness of the conductive traces or connection pads, for example, may be as low as about 10 μm. As shown, the conductive traces are formed over the insulating layer 374 and top surface of the conductive studs 372 in the die and non-die regions of the package substrate and are electrically coupled to the conductive studs 372. The conductive traces 130 may be extended from the side surfaces of the conductive studs 372. In cases where the conductive studs 372 include a multi-layered stack, the conductive traces 130 may extend from the two or more layers of the multi-layered stack of the conductive studs 372.

Figure 15G:
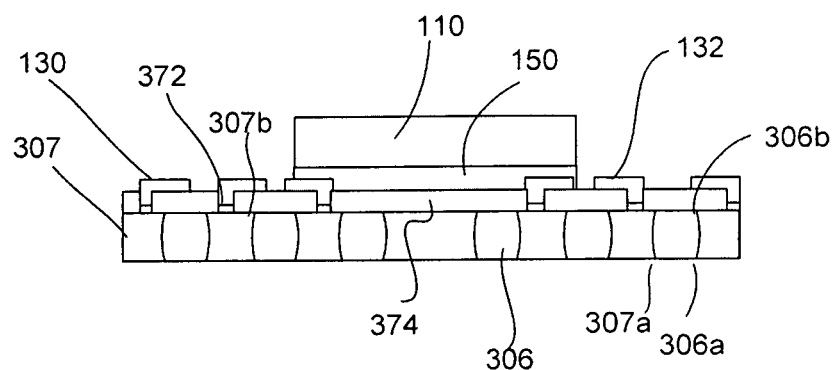
Figure 15H:
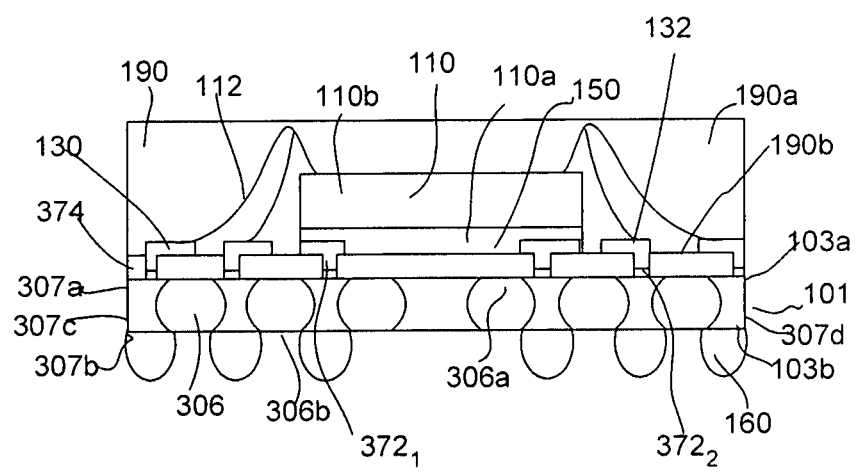

A die 110 which includes circuit components similarly described in FIG. 10i is attached by an adhesive layer 150 to the die region of the package substrate as shown in FIG. 15g. The process continues, as similarly described in FIG. 10i and onwards. As such, these process steps will not be described or described in detail. The process continues until a package as shown in FIG. 15h similar to that shown in FIG. 8 is formed.

Figure 16A:
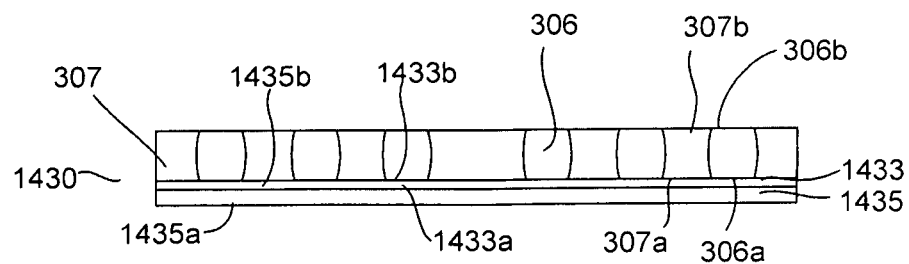

FIGS. 16a-g show another embodiment of a process for forming a semiconductor package. The process include similar processes to that described in FIGS. 10a-j, FIGS. 11a-d, FIGS. 12a-f and FIGS. 13a-f, FIGS. 14a-e and FIGS. 15a-h. As such, common elements may not be described or described in detail. Referring to FIG. 16a, a partially processed package substrate is provided. The partially processed package substrate is at the stage of processing as described in FIG. 15c. For example, mold material, for example, remains in the cavities in between the via contacts 307. The mold materials which remain in between the via contacts after the grinding process may be referred to as the base substrate 306 of the package substrate. The mold materials also serve as insulating layer providing electrical isolation between adjacent via contacts.

Figure 16B:
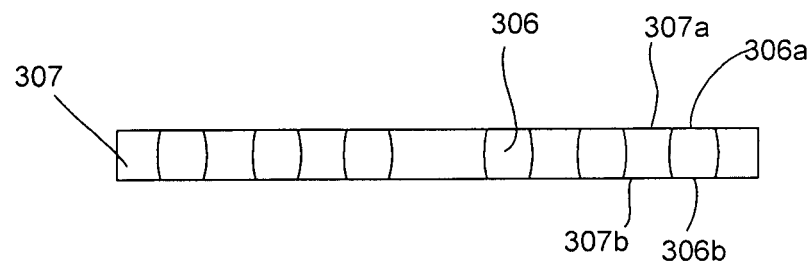

The process continues by removing the second and third conductive layers 1433 and 1435 of the conductive carrier as shown in FIG. 16b. In one embodiment, the second and third conductive layers of the conductive carrier is removed by an etch process. The etch process, for example, may be a two-step etch process. The first etch, for example, removes the third conductive layer 1435. Thus, the second conductive layer 1433 serves as an etch stop layer during the removal of the third conductive layer 1435. The second etch, for example, removes the second conductive layer 1433. The second etch, for example, stops at the first surface 307a of the via contacts. Other suitable types of techniques may also be employed to remove the second and third conductive layers.

Figure 16C:
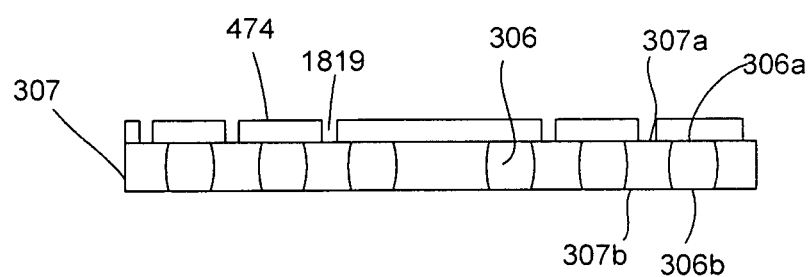

Referring to FIG. 16c, the process continues to form further interconnect level for the package substrate. In one embodiment, an insulating layer 474 is provided over the first surface 307a of the via contacts and the base substrate 306a as shown in FIG. 16c. In one embodiment, the insulating layer includes a photosensitive dielectric material such as a UV sensitive laminate. The thickness of the insulating layer 474 defines the thickness of conductive studs 472 to be formed later. The insulating layer, for example, may be formed by molding or lamination technique. Other types of dielectric materials and deposition techniques may also be useful for forming the insulation layer.

The process continues to remove portions of the insulating layer. In one embodiment, the insulating 474 layer is patterned to create cavities 1819 which define the locations where conductive studs 472 of the package substrate are to be formed as shown in FIG. 16c. The width of the cavities, for example, is smaller than the width of the via contacts. Patterning of the insulating layer may be performed with the help of a patterned masked layer. Patterning of the insulating layer can be achieved by any suitable etching techniques. For example, a patterned etch mask (not shown), such as photoresist, is provided over the insulating layer. An etch may be performed using the etch mask to remove portions of the insulating layer unprotected by the etch mask. The etch, for example, may be an isotropic etch, such as a wet etch. An isotropic etch, such as reactive ion etch (RIE) may be used. Other techniques for patterning the insulating layer may also be useful.

Figure 16D:
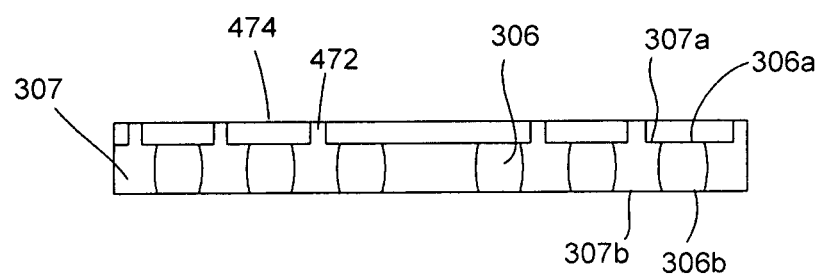

The process continues to form conductive studs 472 over the via contacts 307 as shown in FIG. 16d. In one embodiment, the conductive studs 472 may be formed of a single conductive material. The conductive studs, for example, may include the same material as the via contacts. In another embodiment, the conductive studs may be formed of two or more conductive materials, forming a multi-layered stack. The multi-layered stack, for example, may include copper, nickel or a combination thereof. Other types of conductive materials may also be useful.

In one embodiment, the conductive studs 472 are formed by plating. For example, electrochemical or electroless plating may be employed to form the conductive studs. Thus, one or more layer may be plated to form the conductive studs. The first surface 307a of the via contacts thus also serves as a base or substrate for the electroplating process. Other suitable methods for forming the conductive studs may also be used. The thickness of the conductive studs, for example, may be about the same as or lower than the thickness of the insulating layer 474.

Figure 16E:
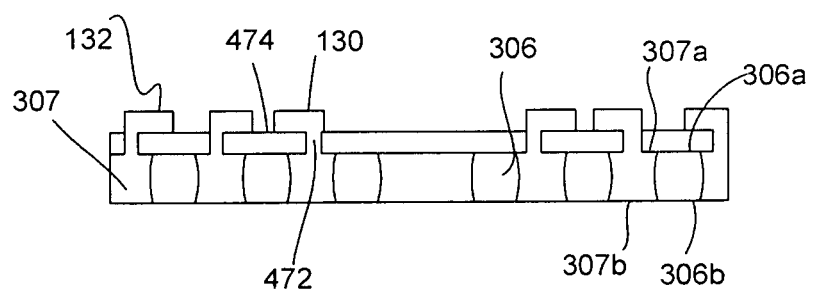

The process continues to form conductive traces and connection pads of the package substrate as shown in FIG. 16e. In one embodiment, the conductive traces 130 and connection pads 132 are formed of the same material as the conductive studs. Other types of conductive materials, such as different than the conductive studs, may also be useful. The conductive traces 130 and connection pads 132, in one embodiment, are formed by plating. For example, electrochemical or electroless plating may be employed to form the conductive traces and connection pads. The first surface 472a of the conductive studs thus also serves as a base or substrate for the electroplating process. Other suitable methods for forming the conductive traces and connection pads may also be used. The thickness of the conductive traces or connection pads, for example, may be as low as about 10 µm. As shown, the conductive traces and connection pads are formed over the insulating layer 474 and top surface of the conductive studs in the die and non-die regions of the package substrate and are electrically coupled to the conductive studs 472.

Figure 16F:
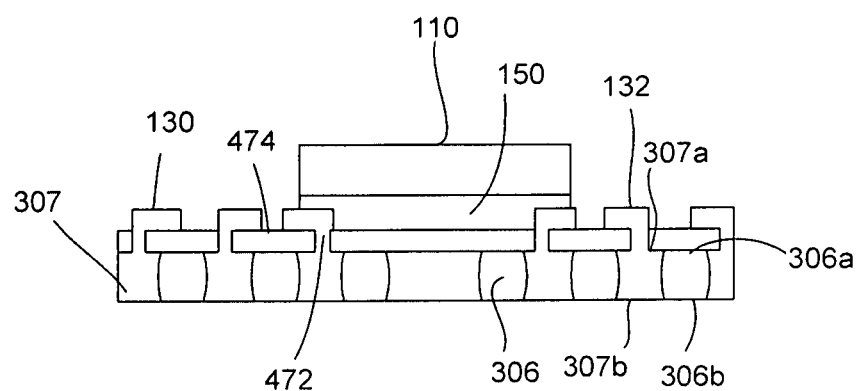
Figure 16G:
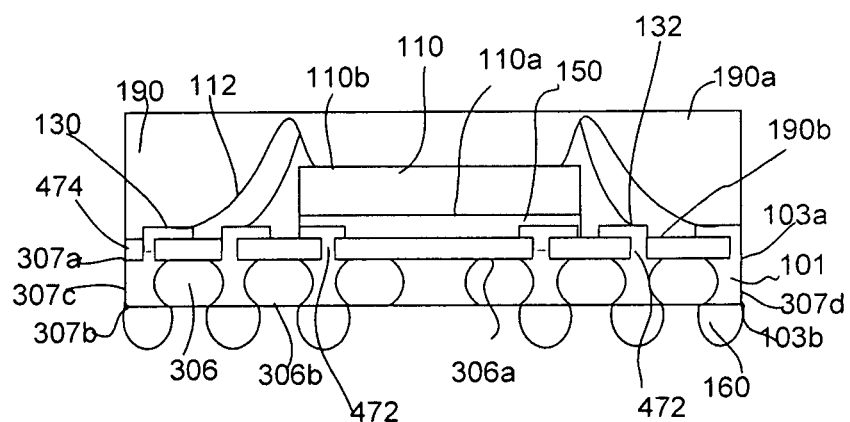

A die 110 which includes circuit components similarly described in FIG. 10i is attached by an adhesive layer 150 to the die region of the package substrate as shown in FIG. 16f. The process continues, as similarly described in FIG. 10i and onwards. As such, these process steps will not be described or described in detail. The process continues until a package as shown in FIG. 16g similar to that shown in FIG. 9 is formed.

The embodiments described with respect to FIGS. 15a-h and FIGS. 16a-g include some or all advantages as described with respect to FIG. 10a j, FIGS. 11a-d, FIGS. 12a-f, FIGS. 13a-f and FIGS. 14a-e. As such, these advantages will not be described or described in detail. The embodiments, as described with respect to FIGS. 15a-h and FIGS. 16a-g result in further advantages. For example, the second conductive layer acts as a barrier during the removal of portions of the first conductive layer to form the via contacts. As such, the thickness of the via contacts may be varied depending on the thickness of the first conductive layer as provided. Moreover, the via contacts as described in the embodiments of FIGS. 15a-h and FIGS. 16a-g are formed by an etch process. Such technique offers a less costly solution to form via contacts relative to other techniques.

The embodiments as described in FIGS. 15a-h and FIGS. 16a-g allows the interconnect structures, including the via contacts, conductive studs and conductive traces, to be formed at the peripheries of the package substrate. As such, the side surfaces of the interconnect structures at the peripheries of the package substrate are exposed. Such configuration improves the thermal performance of the package or may be used as castellation leads for clip connections.

The embodiments as described in FIGS. 10a-j, FIGS. 11a-d, FIGS. 12a-f, FIGS. 13a-f FIGS. 14a-e, FIGS. 15a-h and FIGS. 16a-g provide flexibility and are customizable based on design requirements. For example, for application where larger pitch is desired, for example, solder joint pin applications, etching process may be employed. On the other hand, for applications which require smaller pitch and high density line/space area (e.g., conductive traces), plating process may be used. The line/space pitch formed by plating process is advantageous as it is finer and more stable.

Figure 17:
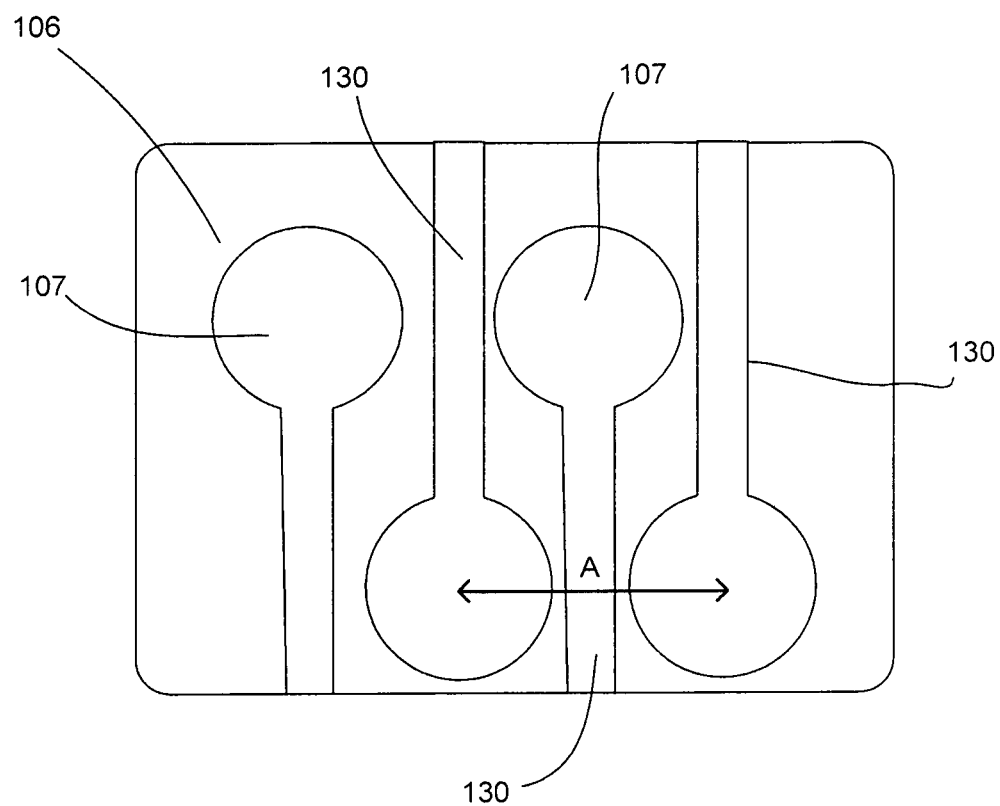
FIGS. 17-18 show top views of a first surface of various embodiments of a package substrate.
Figure 18:
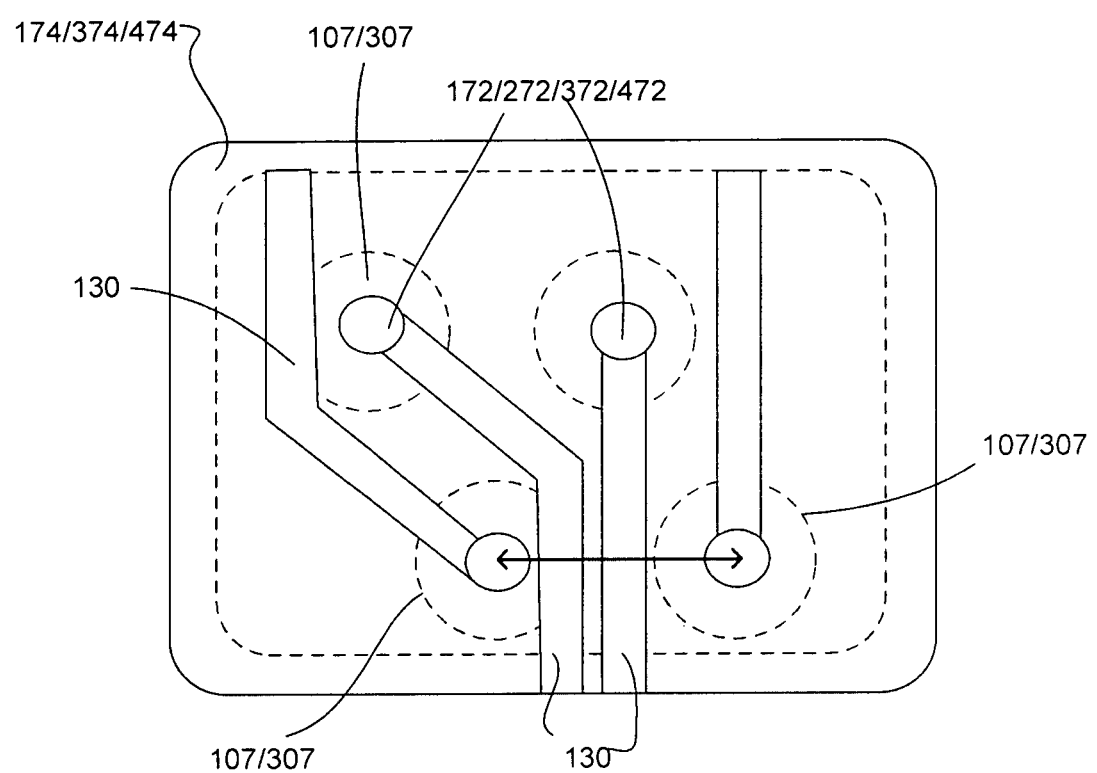

FIGS. 17-18 show top views of a first surface of various embodiments of a package substrate. For example, FIG. 17 shows top view of a first surface of the embodiments as described in FIGS. 1-3. As shown in FIG. 17, depending on the capability of chemical etching technique, one conductive trace is able to pass between two via contacts within a pitch A. FIG. 18, on the other hand, shows top view of a first surface of the embodiments as described in FIGS. 4-9. Referring to FIG. 18, the package substrate includes conductive studs. For the same pitch A, the conductive studs enable at least two or more traces to pass between two via contacts, depending on the width of the conductive studs. Moreover, the conductive studs need not be positioned at the center of the via contacts, resulting in more flexible and efficient routability of traces.

The invention may be embodied in other specific forms without departing from the spirit or essential characteristics thereof. The foregoing embodiments, therefore, are to be considered in all respects illustrative rather than limiting the invention described herein.

What is claimed is:

1. A semiconductor package comprising:
   a package substrate having first and second major surfaces, wherein the package substrate comprises a base substrate having a mold material and a plurality of via contacts extending through the base substrate from the first to the second major surface of the package substrate;
   an adhesive disposed on and covering a top surface of the base substrate, wherein the via contacts extend above the top surface of the base substrate and the adhesive is about aligned to sides of the via contacts;
   an insulating layer having first and second major surfaces, wherein the insulating layer is disposed directly over the adhesive and the via contacts;
   a plurality of conductive studs disposed within the insulating layer, wherein the conductive studs extend from the first to the second major surface of the insulating layer, wherein a width of the conductive studs is smaller than a width of the via contacts;
   conductive traces disposed directly on the first major surface of the insulating layer and over the conductive studs;
   a die having conductive contacts on its first or second surfaces disposed on the package substrate, wherein the conductive contacts of the die are electrically coupled to the conductive traces; and
   a cap disposed over the package substrate and encapsulates the die, wherein a bottom of the cap contacts the conductive traces and the first major surface of the insulating layer.

2. The semiconductor package of claim 1 wherein the insulating layer electrically isolates the plurality of conductive studs from each other, wherein a top surface of the conductive studs is coplanar to the first major surface of the insulating.

3. The semiconductor package of claim 2 wherein the second major surface of the insulating layer partially covers and contacts a top surface of the via contacts.

4. The semiconductor package of claim 2 wherein the second major surface of the insulating layer contacts the adhesive and the via contacts.

5. The semiconductor package of claim 1 wherein the conductive traces are coupled to the conductive studs, wherein the conductive studs couple the conductive traces to the via contacts, wherein the via contacts, the conductive studs and the conductive traces correspond to interconnect structures of the package substrate.

6. The semiconductor package of claim 5 wherein the conductive studs comprise a multi-layered stack having at least a first conductive layer and a second conductive layer different from the first conductive layer.

7. The semiconductor package of claim 6 wherein the first conductive layer comprises a nickel layer and the second conductive layer comprises a copper layer and the second conductive layer contacts the via contacts.

8. The semiconductor package of claim 5 wherein the via contacts correspond to a first interconnect level, wherein the conductive studs correspond to a second interconnect level, wherein the conductive traces correspond to a third interconnect level, wherein the first, second and third interconnect levels define the interconnect structures of the package substrate.

9. The semiconductor package of claim 1 wherein the adhesive comprises a UV sensitive laminate material.

10. The semiconductor package of claim 1 wherein the width of the conductive studs is defined by a circumference of the conductive studs and the width of the via contacts is defined by a circumference of the via contacts, wherein one or more of the conductive studs are disposed directly on a top surface of the via contact and do not extend laterally beyond the width of the via contact.

11. The semiconductor package of claim 1 comprising package contacts disposed on a bottom surface of the base substrate, wherein the package contacts are coupled to a bottom of the via contacts.

12. The semiconductor package of claim 11 wherein the package contacts protrude downwardly from the bottom surface of the base substrate.

13. The semiconductor package of claim 1 wherein the conductive studs comprise a same conductive material as the via contacts.

14. The semiconductor package of claim 13 wherein the conductive traces comprise a same conductive material as the conductive studs.

15. The semiconductor package of claim 1 wherein the insulating layer is disposed between and separates the conductive traces from the adhesive.

16. A semiconductor package comprising:
    a package substrate having a top and a bottom surface, wherein the package substrate comprises a base substrate having a mold material and a plurality of via contacts, wherein the via contacts extend through the base substrate from the top surface to the bottom surface of the package substrate;
    an adhesive disposed on and covering a top surface of the base substrate, wherein the via contacts extend above the top surface of the base substrate and the adhesive abuts sides of the via contacts;
    an insulating layer having first and second major surfaces, wherein the insulating layer is disposed directly on the adhesive, wherein the second major surface of the insulating layer contacts a top surface of the via contacts;
    a plurality of conductive studs disposed within the insulating layer, wherein the conductive studs extend from the first to the second major surface of the insulating layer, wherein a width of the conductive studs is smaller than a width of the via contacts;
    conductive traces disposed directly on the insulating layer and over the conductive studs;
    a die mounted on the package substrate;
    a cap disposed over the package substrate and encapsulates the die; and
    wherein a bottom of the cap contacts the conductive traces and the insulating layer.

17. The semiconductor package of claim 16 wherein the die comprises conductive contacts, wherein the conductive contacts of the die are electrically coupled to the conductive traces on the insulating layer.

18. The semiconductor package of claim 16 wherein the insulating layer electrically isolates the plurality of conductive studs from each other, wherein the insulating layer separates the conductive traces from the via contacts and the adhesive.

19. The semiconductor package of claim 16 wherein the conductive studs comprise a multi-layered stack having at least a first conductive layer and a second conductive layer below the first conductive layer, wherein the first conductive layer contacts the conductive traces and comprises a conductive material different from the conductive traces and the via contacts.

20. The semiconductor package of claim 16 comprising package contacts which are directly coupled to a bottom surface of the via contacts, wherein the bottom surface of the via contacts are recessed relative to a bottom surface of the base substrate.

* * * * *